(12) United States Patent
Fujitani et al.

(10) Patent No.: US 7,298,045 B2
(45) Date of Patent: Nov. 20, 2007

(54) STACKED SEMICONDUCTOR DEVICE

(75) Inventors: Hisaki Fujitani, Kyoto (JP); Fumito Itou, Ibaraki (JP); Toshitaka Akahoshi, Kyoto (JP); Toshiyuki Fukuda, Nagaokakyo (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 148 days.

(21) Appl. No.: 10/995,140

(22) Filed: Nov. 24, 2004

(65) Prior Publication Data

US 2005/0116353 A1 Jun. 2, 2005

(30) Foreign Application Priority Data

Nov. 28, 2003 (JP) ............................. 2003-398288
Jul. 5, 2004 (JP) ............................. 2004-197483

(51) Int. Cl.
*H01L 23/34* (2006.01)
(52) U.S. Cl. ...................... 257/724; 257/723; 257/725; 257/E23.003
(58) Field of Classification Search ................ 257/723, 257/724, 725, E23.003
See application file for complete search history.

(56) References Cited

FOREIGN PATENT DOCUMENTS

| JP | 05-275578 | 10/1993 |
|---|---|---|
| JP | 10-084076 | 3/1998 |
| JP | 2000-243875 | 9/2000 |
| JP | 2001-320013 | 11/2001 |
| JP | 2002-110851 | 4/2002 |
| JP | 2002-270763 | 9/2002 |
| JP | 2003-347505 | 12/2003 |

*Primary Examiner*—Ngân V. Ngô
(74) *Attorney, Agent, or Firm*—Steptoe & Johnson LLP

(57) ABSTRACT

A first semiconductor element and second semiconductor element are bonded via die-bonding material. A first electrode of the first semiconductor element and a third electrode are joined, by means of flip-chip bonding, to a semiconductor carrier that has the third electrode on the one face of the semiconductor carrier and a fourth electrode on the perimeter of the other face of the semiconductor carrier. The bonding pad of the second semiconductor element and the fourth electrode of the semiconductor carrier are connected via fine metal wire by means of wire bonding. The periphery of the first semiconductor element and the wiring portion of the fine metal wire are filled with insulating sealing resin between the semiconductor carrier and second semiconductor element and the sealing fill region for the sealing resin is formed substantially the same as the external dimensions of the second semiconductor element.

9 Claims, 19 Drawing Sheets

FIG. 9B

STACKED SEMICONDUCTOR DEVICE

BACKGROUND OF THE INVENTION

1. Field of the Invention

The present invention relates to a stacked-type semiconductor device in which a plurality of semiconductor elements are stacked and to a fabrication method thereof.

2. Description of the Related Art

Miniaturized thin stacked-type semiconductor devices in which a plurality of semiconductor elements are stacked, such as semiconductor devices in which a plurality of semiconductor memories are installed, are in demand in keeping with the expansion of the functions of small and lightweight portable information devices and so forth.

First, a first conventional example disclosed in Japanese Unexamined Patent Publication No. 2002-270763 (a semiconductor device in which a semiconductor carrier electrode and an upper semiconductor element electrode are connected by means of a fine metal wire) will be described with reference to FIGS. 23A and 23B.

The semiconductor device disclosed in the first conventional example is such that the surface of a first semiconductor element 53, which has bumps 56 formed on surface electrodes, is oriented downward and the semiconductor element 53 is joined to a semiconductor carrier 51, which is a multilayered circuit wiring substrate. A plurality of first electrodes 62 for conduction with the first semiconductor element 53 and a second plurality of electrodes 52 for conduction with a second semiconductor element 58 are formed on the upper surface of the semiconductor carrier 51. Further, this plurality of first electrodes 62 and the bumps 56 that are formed on the first semiconductor element 53 are joined by means of conductive adhesive 65. This conductive adhesive 65 is supplied to the bumps 56 beforehand. Further, underfill material 54 is made to fill and insulate the gap between the mutually joined first semiconductor element 53 and semiconductor carrier 51. In addition, a second semiconductor element 58 is bonded via die-bonding material 57 to the rear face (the upper face in FIG. 23A) of the first semiconductor element 53 such that the second semiconductor element 58 and first semiconductor element 53 are stacked. Further, wire bonding is used to connect electrically bonding pads 59 on the second semiconductor element 58 and a plurality of second electrodes 52 on the upper face of the semiconductor carrier 51 to one another via fine metal wires 60. In addition, an insulating sealing resin 63 is made to fill and seal the wiring portion of the fine metal wires 60 and the periphery of the first semiconductor element 53 between the second semiconductor element 58 and semiconductor carrier 51. Finally, external terminal electrodes 61 are mounted on the lower face (external face) of the semiconductor carrier 51.

Next, a second conventional example disclosed in Japanese Unexamined Patent Publication No. 2003-347505 (a semiconductor device in which inner leads are adopted in place of the fine metal wires that are used in the first conventional example) will now be described with reference to FIGS. 24A and 24B.

The semiconductor device disclosed in the second conventional example has a first semiconductor element 73, a second semiconductor element 78, and a tape carrier 71 stacked and arranged in the same package. Further, the tape carrier 71 and the semiconductor elements 73 and 78 are electrically connected by means of inner leads 75 of the tape carrier 71. That is, a plurality of lands 72 is formed on an array that is provided on the surface of the tape carrier 71 and external terminal electrodes 81 are mounted on the lands 72. Further, the inner leads 75, which extend from the lands 72, are each bonded to electrode pads 74 of the first semiconductor element 73 and/or to the electrode pads 79 provided on the upper-face perimeter of the second semiconductor element 78. In addition, sealing resin 83 is made to fill from the upper face of the second semiconductor element 68 to the outer perimeter of the tape carrier 71, whereby the inner leads 75 and bonding pads 74 and 79 are protected.

However, the semiconductor device of the first conventional example includes factors that obstruct miniaturization. That is, the semiconductor device uses wire bonding to connect the bonding pads 59 of the second semiconductor element 58 to the second electrodes 52 of the semiconductor carrier 51. In a case where the connections are made by using wiring bonding, as shown in FIG. 23B, a sealing fill region (bonding area) 70, which is filled by means of insulating sealing resin 63, must be provided at least as far as the outside of the second semiconductor element 58 so that the fine metal wires 60 jut out further than the outer edge of the second semiconductor element 58. Hence, the mounting area is larger than that of the second semiconductor element 58, which is an impediment to miniaturization of the semiconductor device.

There has also been a problem that because the first semiconductor element 53 and second semiconductor element 58 are completely sealed with resin, the semiconductor device is caused to be inferior in heat radiation.

In addition, the semiconductor device of the second conventional example above includes factors obstructing an increased number of pins (a greater number of the external terminal electrodes 81). That is, with the semiconductor device, the semiconductor elements 73 and 78, which are arranged stacked in the same package, are electrically connected to the lands 72 by means of the inner leads 75. Hence, the number of lands 72 arranged is limited by the amount of wiring of the inner leads 75. Further, there must be a smaller number of mounting parts of the semiconductor elements 73 and 78 than the semiconductor device. The above factors obstruct any increase in the number of pins of the semiconductor device.

SUMMARY OF THE INVENTION

The present invention solves the above problems, and has an object to provide a semiconductor element device that allows advances in miniaturization and possesses superior heat radiation, and a fabrication method for the semiconductor element device.

In the case of the present invention, the second semiconductor element is bonded to the one face of the first semiconductor element on the other face of which a first electrode is provided. The second semiconductor element is formed larger than the first semiconductor element and a second electrode is provided on the outer perimeter of the other face. A third electrode on the one face of a wiring substrate is joined by means of flip-chip bonding to the first electrode of the first semiconductor element. A fourth electrode provided on the outer perimeter of the other face of the wiring substrate and the second electrode of the second semiconductor element are connected via fine metal wire by means of wire bonding. The periphery of the first semiconductor element and the wiring portion of the fine metal wire are sealed by means of insulating sealing resin between the second semiconductor element and the wiring substrate, and a sealing fill region for the sealing resin is formed substantially the same as the external dimensions of the second semiconductor element.

BRIEF DESCRIPTION OF THE DRAWINGS

FIGS. 9A to 9F are side cross-sectional views illustrating a first fabrication procedure of the same semiconductor device;

DESCRIPTION OF THE PREFERRED EMBODIMENTS

First Embodiment

A first embodiment of the semiconductor device according to the present invention and a first embodiment of the first and second fabrication methods of the semiconductor device will now be described with reference to FIGS. 1 to 3.

Figure 1:
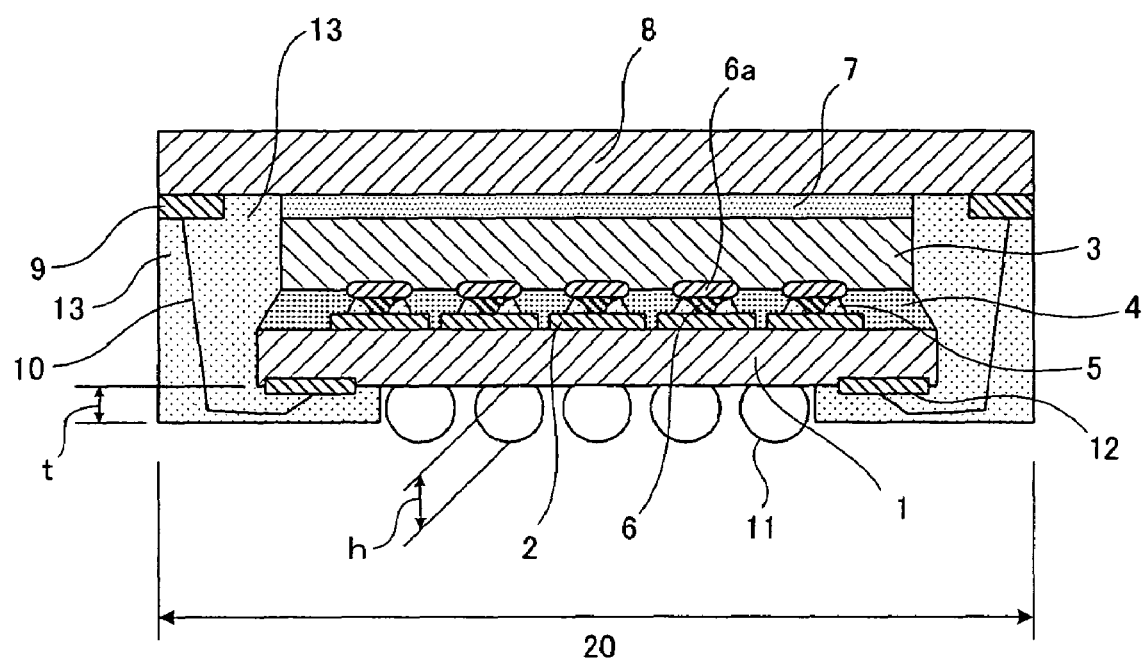
FIG. 1 is a side cross-sectional view of a first embodiment of a semiconductor device according to the present invention.

As shown in FIG. 1, the semiconductor device comprises a first semiconductor element 3, a second semiconductor element 8, and a semiconductor carrier 1 constituting a multilayered circuit wiring substrate.

The first semiconductor element 3 has a plurality of bumps 6 constituting protruding electrodes formed on electrodes 6a, which are first electrodes on the other face (referred to as the lower face in FIG. 1 hereinafter). Further, the second semiconductor element 8 is formed with a larger outer diameter dimension than the first semiconductor element 3 and bonding pads 9, which are second electrodes, are formed on the outer perimeter that is outside the outer diameter dimension of the first semiconductor element 3 on the other face. The semiconductor carrier 1 has a plurality of first adhesive layers 2, which are third electrodes, formed on the one face (referred to as the upper face in FIG. 1 hereinafter) in correspondence with the plurality of bumps 6 and has a plurality of second adhesive layers 12, which are fourth electrodes, formed on the outer perimeter of the other face. As the material of the semiconductor carrier 1 used here, materials such as a glass epoxy board, an organic substrate or ceramic substrate can be adopted. A glass epoxy board is used here.

Further, a plurality of external terminal electrodes 11 is formed on the semiconductor carrier 1. The external terminal electrodes 11 allow conduction to a predetermined first adhesive layer 2 on the outer perimeter of the other face. The external dimensions of the semiconductor carrier 1 are formed the same or somewhat larger than the external dimensions of the first semiconductor element 3. Further, because the semiconductor carrier 1 must make an electrical connection with the second semiconductor element 8, a size is adopted for the external dimensions of the semiconductor carrier 1 that is at least one millimeter or more smaller than the external dimensions of the second semiconductor element 8. In addition, the other face of the second semiconductor element 8 is bonded via die-bonding material 7 to the one face of the first semiconductor element 3. Flip-chip bonding is used to bond the bumps 6 of the first semiconductor element 3 to the first adhesive layer 2 of the semiconductor carrier 1 via a conductive adhesive 5 and the semiconductor carrier 1 is stacked on the other face of the first semiconductor element 3. In addition, underfill material 4 is introduced to the gap between the first semiconductor element 3 and semiconductor carrier 1 and to the periphery thereof, whereby the bumps 6 are protected. Furthermore, wire bonding is used to form a connection via fine metal wires 10 with the first adhesive layer 2 that is formed from the bonding pads 9 of the second semiconductor element 8 to the periphery of the other face of the semiconductor carrier 1.

In addition, in order to protect the first semiconductor element 3, the second semiconductor element 8 and the fine metal wires 10, an insulating sealing resin 13 is made to fill and seal the periphery of the semiconductor carrier 1 and the wiring portion of the fine metal wires 10 from the other face of the second semiconductor element 8 to the semiconductor carrier 1. Further, a sealing fill region 20 for the sealing resin 13 is formed over substantially the same area as the external dimensions of the second semiconductor element 8.

First Fabrication Method of the Semiconductor Device.

Next, the first fabrication method of the semiconductor device according to the first embodiment will be described with reference to FIGS. 2A to 2E.

Figure 2A:
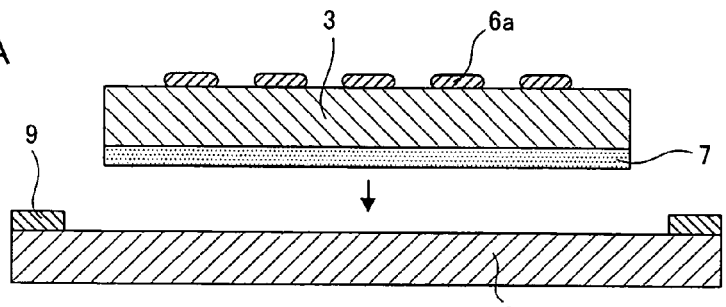
FIGS. 2A to 2E are explanatory views of a first fabrication procedure of the same semiconductor device.

As shown in FIG. 2A, the other face of the first semiconductor element 3 is bonded via the die-bonding material 7 to the one face of the second semiconductor element 8 (step A). An insulating paste, insulating sheet, or the like, can be adopted as this die-bonding material 7 but an insulating sheet is used here.

Figure 2B:
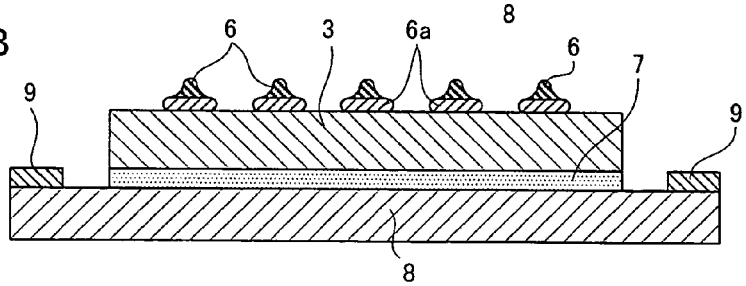

As shown in FIG. 2B, the bumps 6 are formed on the electrodes 6a of the first semiconductor element 3. Plated bumps or stud bumps for which metal is used can be adopted as the bumps but stud bumps are employed here.

Figure 2C:
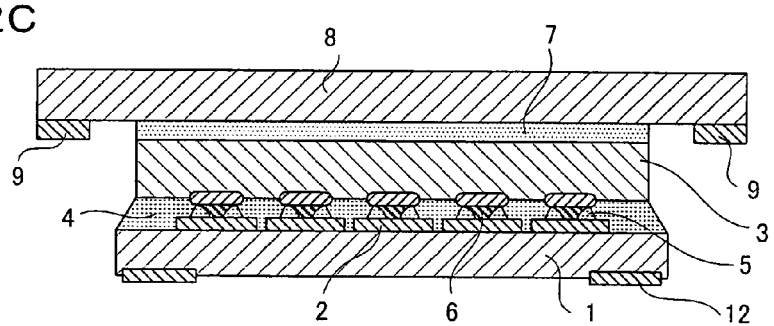

Next, as shown in FIG. 2C, after the conductive adhesive 5 has been supplied to the bumps 6, the semiconductor device is inverted and disposed on the semiconductor carrier 1 so that the second semiconductor element 8 faces upward. The bumps 6 and first adhesive layer 2 are then joined by flip-chip bonding such that the first semiconductor element 3 is stacked on the semiconductor carrier 1 (step B). Underfill material 4 is also introduced to the gap between the first semiconductor element 3 and semiconductor carrier 1 and to the periphery thereof, whereby the bumps 6 are protected (step C).

Figure 2D:
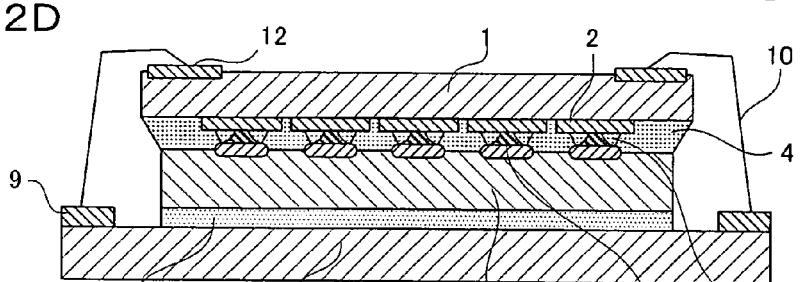

As shown in FIG. 2D, the semiconductor device is inverted so that the second semiconductor element 8 faces downward. Second adhesive layers 12 are then formed on the periphery of the other face of the semiconductor carrier 1. Wire bonding is then used to connect electrically the bonding pads 9 of the second semiconductor element 8 and the second adhesive layer 12 via fine metal wires 10 (step D).

Figure 2E:
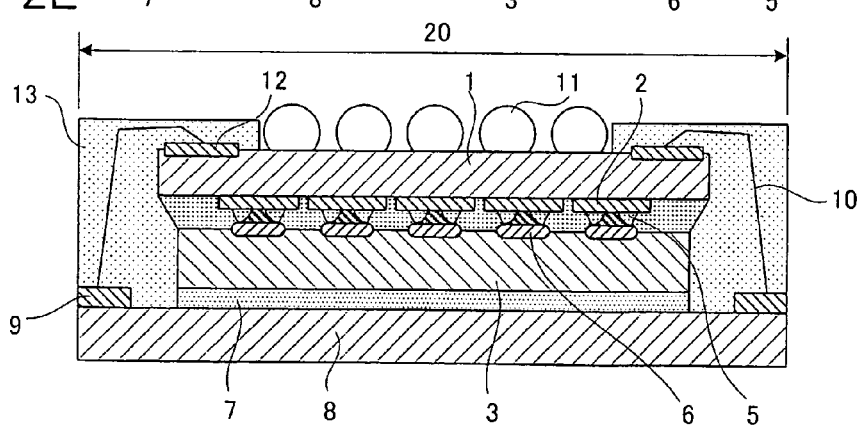

As shown in FIG. 2E, in order to protect the first semiconductor element 3, the second semiconductor element 8, and the fine metal wires 10, sealing resin 13 is made to fill and seal the periphery of the first semiconductor element 3 and semiconductor carrier 1 from the other face of the second semiconductor element 8 to the semiconductor carrier 1 and the wiring portion of the fine metal wires 10 (step E). Here, a sealing fill region (bonding area) 20, which is filled with the sealing resin 13, is formed over substantially the same area as the external dimensions of the second semiconductor element 8. Next, fabrication of the semiconductor device is completed by attaching external terminal electrodes 11.

Further, as a modified example of the first fabrication method above, the order of fabrication may be such that the second semiconductor element 8 is bonded via die-bonding material 7 to the rear face of the first semiconductor element 3 (step A) after first joining the first semiconductor element 3 to the one face of the semiconductor carrier 1 by means of flip-chip bonding (step B) and introducing underfill material 4 (step C), that is, the order may be step B, step C, step A, step D, and step E.

Here, as shown in FIG. 1, in order to achieve a favorable connection between the external terminal electrodes 11 and the outside, the thickness:t of the sealing resin 13 protecting the fine metal wires 10 and second adhesive layer 12 is formed thinner than the mounting height:h of the external terminal electrodes 11. This is because, when the thickness:t of the sealing resin 13 is greater than the height:h of the external terminal electrodes 11, the thickness:t of the sealing resin 13 is an obstacle when the semiconductor device is mounted, which hinders the connection with the external terminal electrodes 11. For example, the mounting height:h of the external terminal electrodes 11=approximately 250 µm, the thickness:t of the sealing resin 13=approximately 200 µm, and the height of the fine metal wires 10 is formed approximately 150 µm from the other face of the semiconductor carrier 1. Implementation may be such that the thickness and height shown here can be optionally changed in accordance with the height of the external terminal electrodes 11. However, in a general semiconductor device, the difference (h−t) between the mounting height:h of the external terminal electrodes 11 and the thickness:t of the sealing resin 13 must be at least 50 µm or more.

(Second Fabrication Method of the Semiconductor Device: Wafer Package Dicing)

Next, the second fabrication method of the semiconductor device according to the first embodiment will be described with reference to FIGS. 3A to 3E and FIGS. 4F to 4J.

Figure 3A:
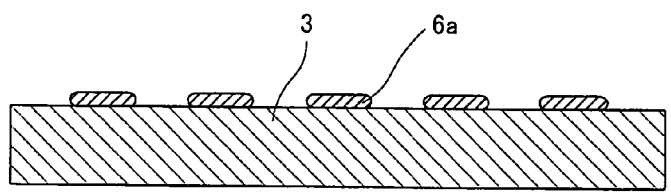
FIGS. 3A to 3E are explanatory views of a second fabrication procedure of the same semiconductor device.
Figure 3B:
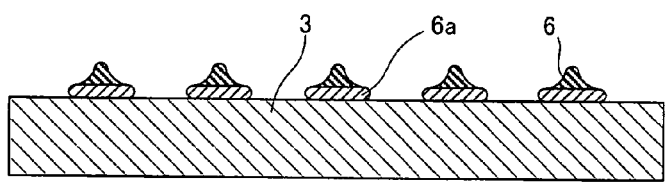

First, as shown in FIG. 3A, electrodes 6a are provided on the other face of the first semiconductor element 3. Next, as shown in FIG. 3B, bumps 6 are formed on the electrodes 6a of the first semiconductor element 3.

Figure 3C:
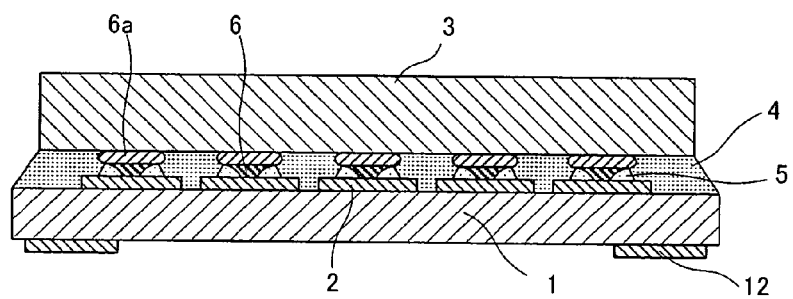

In addition, as shown in FIG. 3C, after the conductive adhesive 5 has been supplied to the bumps 6, the first semiconductor element 3 is inverted and disposed on the semiconductor carrier 1 so that the electrodes 6a face downward. Next, the bumps 6 and first adhesive layer 2 of the semiconductor carrier 1 are joined by means of flip-chip bonding and the first semiconductor element 3 is stacked on the one face of the semiconductor carrier 1 (step B). In addition, underfill material 4 is introduced to the gap between the first semiconductor element 3 and semiconductor carrier 1 and to the periphery thereof, whereby the bumps 6 are protected (step C).

Figure 3D:
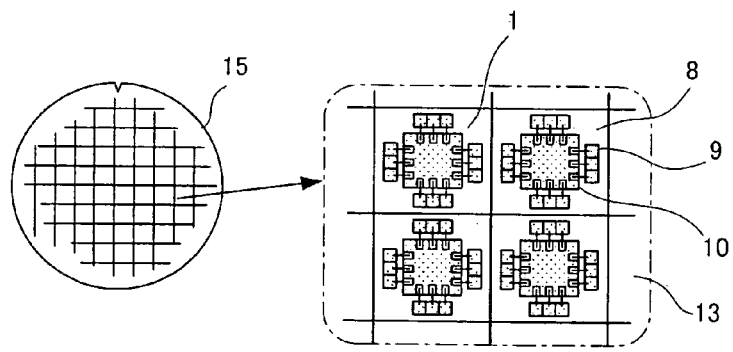
Figure 3E:
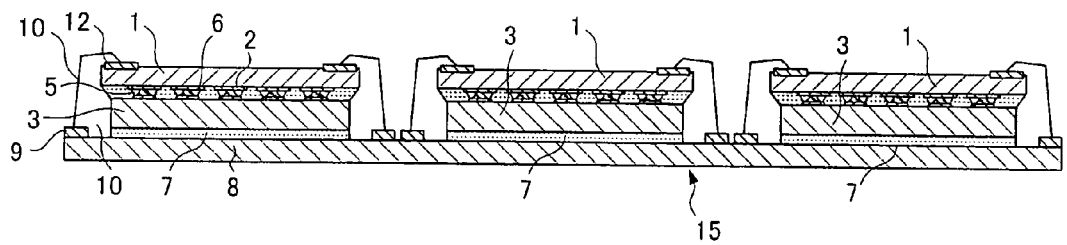

Next, as shown in FIG. 3D, the second semiconductor element 8 is in the state of the wafer substrate (before dicing) 15 on which a plurality of the second semiconductor elements 8 is formed and, as shown in FIG. 3E, the first semiconductor elements 3 are connected via the die-bonding material 7 to the other face of each second semiconductor element 8 in the state of the wafer substrate 15 (step A). The bonding pads 9 of the second semiconductor elements 8 and the second adhesive layers 12 of the semiconductor carriers 1 are electrically connected via the fine metal wires 10 by means of wire bonding (step D). An insulating paste, an insulating sheet, or the like, can be adopted as the die-bonding material but an insulating sheet is employed here.

Figure 4F:
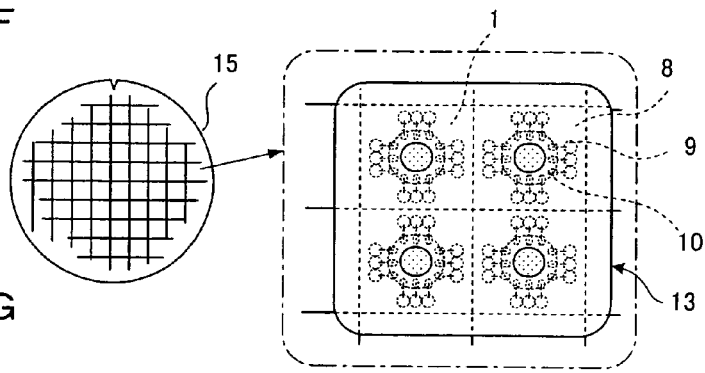
FIGS. 4F to 4J are explanatory views of the second fabrication procedure of the same semiconductor device.
Figure 4G:
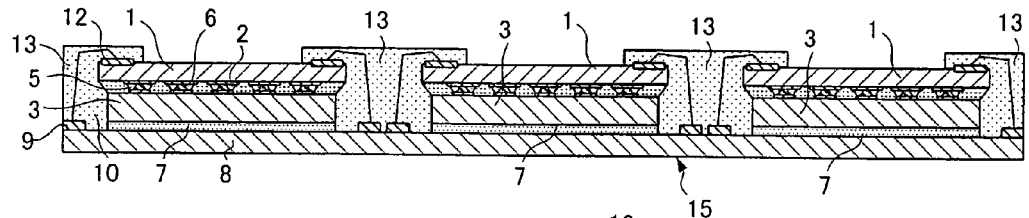

In addition, as shown in FIGS. 4F and 4G, in order to protect the first semiconductor element 3, second semiconductor element 8 and fine metal wires 10, sealing resin 13 is made to fill and seal the periphery of the first semiconductor elements 3 and semiconductor carriers 1 and the wiring portion of fine metal wires 10 from the other face of the second semiconductor element 8 to the semiconductor carrier 1 (step E).

Figure 4H:
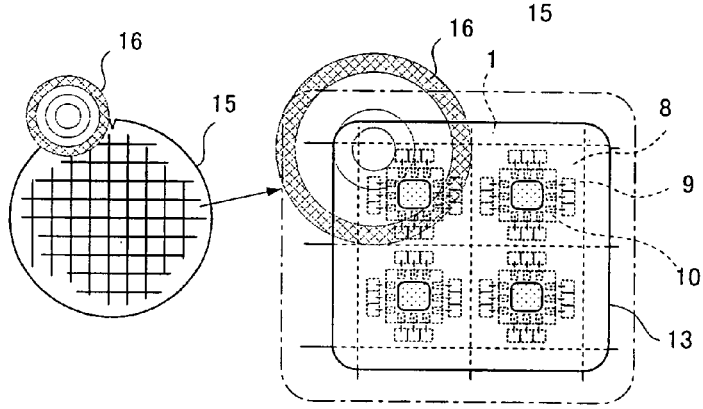
Figure 4:
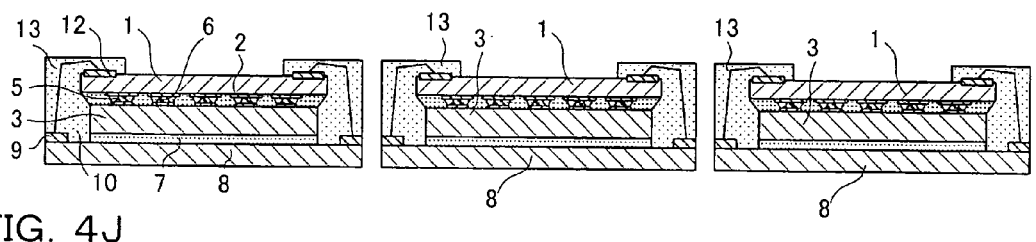

Finally, as shown in FIGS. 4H and 4I, after being resin-sealed, the wafer substrate 15 is diced by using a blade 16 and the semiconductor devices are separated (step F). As a result, the individual semiconductor devices are produced as shown in FIG. 4I.

Figure 4J:
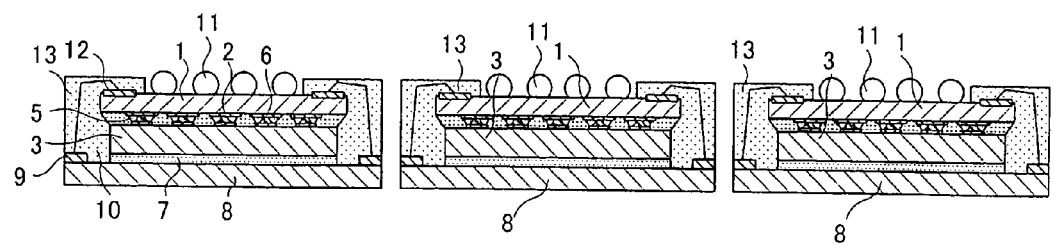

In addition, as shown in FIG. 4J, the external terminal electrodes 11 are attached to the semiconductor carriers 1 (step G). The fabrication of the semiconductor device is thus completed.

The second fabrication method is able to fabricate a plurality of the semiconductor devices by performing together the die-bonding step (step A), wire bonding step (step D), resin-sealing step (step E), and dicing step (step F), which permits efficient fabrication.

As detailed above, according to the first embodiment, within the external form of the second semiconductor element 8, the bonding pads 9 of the second semiconductor element 8 and the second adhesive layers 12 formed on the other face (lower face) of the semiconductor carrier 1 are connected by means of fine metal wires 10 and it is therefore possible to form the sealing resin region 20 that is sealed by the insulating sealing resin 13 substantially the same as the external dimensions of the second semiconductor element 8. Therefore, according to the above first embodiment, because there is no need to arrange the fine metal wires extending to the outside of the semiconductor element by means of wire bonding as per a conventional semiconductor device, in the existing package form, the shortest wire (fine metal wire) length=0.4 mm and the length of the bonding area pad 200 μmm=0.2 mms, and a region of 1.2 mm [=(0.4+0.2)×2] for each package edge is not necessary. Therefore, the sealing fill region 20 can be formed 1 mm or more smaller and a smaller stacked-layer type semiconductor device can be provided.

Figure 5:
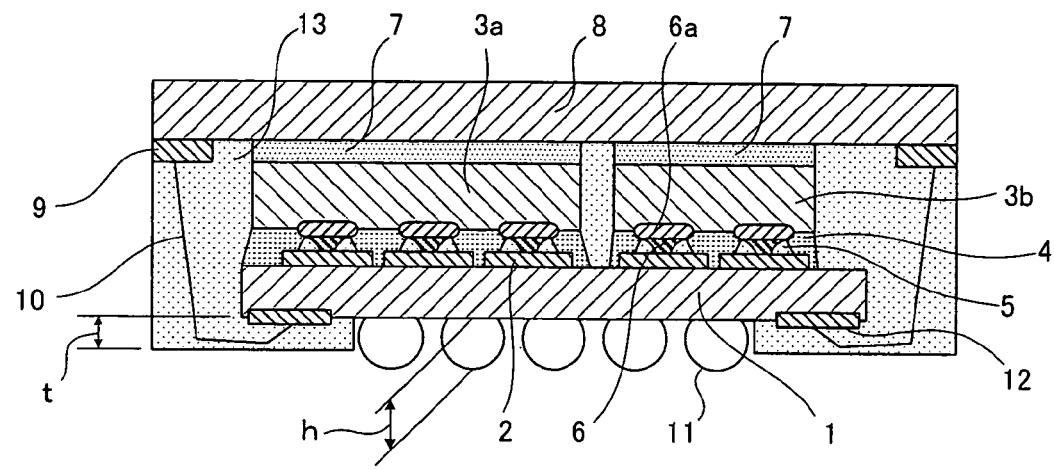
FIG. 5 is a side cross-sectional view of a semiconductor device having a plurality of first semiconductor elements, showing a modified example of the same semiconductor device.

Further, as shown in FIG. 5, the semiconductor device of the first embodiment may have a structure in which a plurality of first semiconductor elements 3a and 3b is arranged on the one face of a semiconductor carrier 21. In this case, in the fabrication method, when first semiconductor elements 3a and 3b are stacked on the one face of the semiconductor carrier 1 by means of flip-chip bonding (step B), the first semiconductor element 3a and first semiconductor element 3b are individually joined to the semiconductor carrier 1 with the first semiconductor element 3a being joined first, followed by the first semiconductor element 3b.

Second Embodiment

Figure 6:
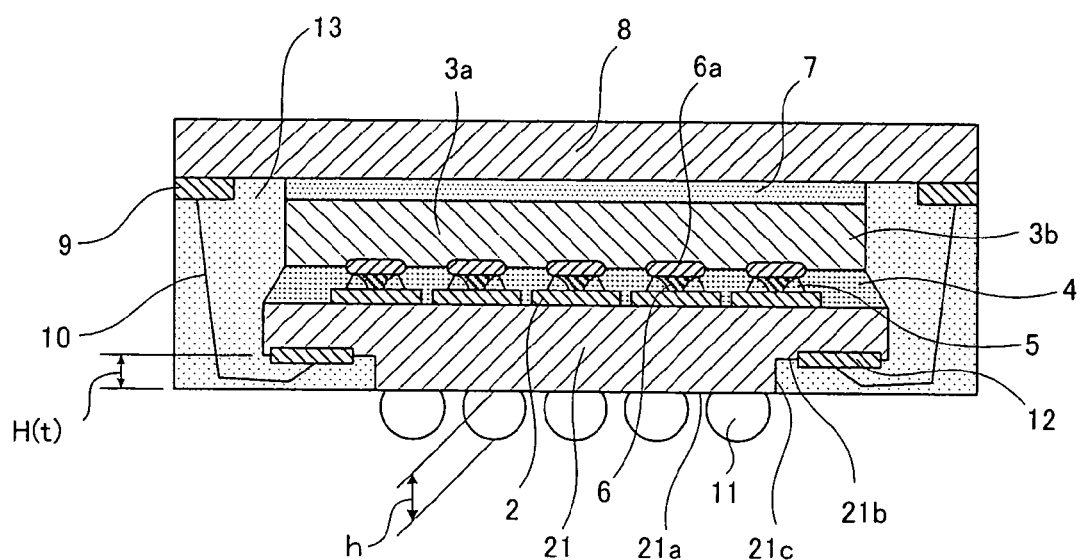
FIG. 6 is a side cross-sectional view showing a second embodiment of the semiconductor device according to the present invention.

The second embodiment of the semiconductor device according to the present invention and fabrication method thereof will now be described with reference to FIG. 6. Further, the same reference numerals were assigned to the same materials as those of the first embodiment and hence a description of these materials is omitted here.

The semiconductor device of the first embodiment is subject to the condition that, in order to establish a favorable connection with the outside of the external terminal electrode 11, the thickness t of the sealing resin 13 that protects the fine metal wires 10 and second adhesive layer 12 should be thinner than the mounting height h of the external terminal electrodes 11. Supposing that the thickness:t of the sealing resin 13 is 200 μm, for example, the mounting height:h of the external terminal electrodes 11 must be 250 μm or more. Hence, when the external terminal electrodes 11 are solder balls, for example, the solder balls must be formed with a size equal to or more than 250 μm. As a result, limitations on the number of terminals to the outside arise and there is the risk of the problem that the condition cannot be applied to the semiconductor device with multiple pins, and so forth.

Here, according to the second embodiment, the semiconductor device, which is subject to minimal restrictions on the mounting height:h of the external terminal electrodes 11, and the fabrication method thereof are provided.

That is, the other face (the lower face in FIG. 6 hereinafter) of the semiconductor carrier 21 comprises a protruding face 21a that is very thick in the middle section and has the external terminal electrodes 11, and a backward face 21b that is formed thin via a step 21c on the outer perimeter of the protruding face 21a and has the second adhesive layer 12. Further, the height:H of the step 21c between the protruding face 21a and the backward face 21b is formed substantially the same as the thickness:t of the sealing resin 13 that covers the fine metal wires 10 and second adhesive layer 12. Because the thickness:t of the sealing resin 13 is taken up by the height H of the step 21c, the surface of the sealing resin 13 and the protruding face 21a can be formed in substantially the same plane and there are no restrictions on the mounting height h of the external terminal electrode 11. Naturally, there is no problem even when the thickness:t of the sealing resin 13<the height:H of the step 21c and, when the thickness:t of the sealing resin 13>the height:H of the step 21c, in cases where this difference is slight, restrictions on the mounting height:h of the external terminal electrodes 11 are minimal.

Therefore, in cases where the external terminal electrodes 11 are solder balls or solder-plated, or similar, the height of the external terminal electrodes 11 can be varied freely. Further, sufficient adaptability is also possible with a LGA (Land Grid Array), in which the external terminal electrodes 11 of the semiconductor carrier 21 are solderless. There are also no restrictions on the number of external terminal electrodes 11 and hence this implementation is applicable to the stacked-type semiconductor device with multiple pins.

Further, the fabrication method of the semiconductor device of the second embodiment permits fabrication by means of the same fabrication method as the first embodiment.

According to the second embodiment, the protruding face 21a with the external terminal electrodes 11 is provided on the other face of the semiconductor carrier 21 and the backward face 21b, which is thin and has the second adhesive layer 12 is provided on the outer perimeter of the protruding face 21a, whereby thickness:t of the sealing resin 13 can be taken up by the height:H. That is, the thickness:t of the sealing resin 13 that covers the second adhesive layer 12 and protrudes from the protruding face 21a is reduced by the height:H from the backward face 21b to the protruding face 21a. Hence, no restrictions on the mounting height h of the external terminal electrodes 11 arise.

Figure 7:
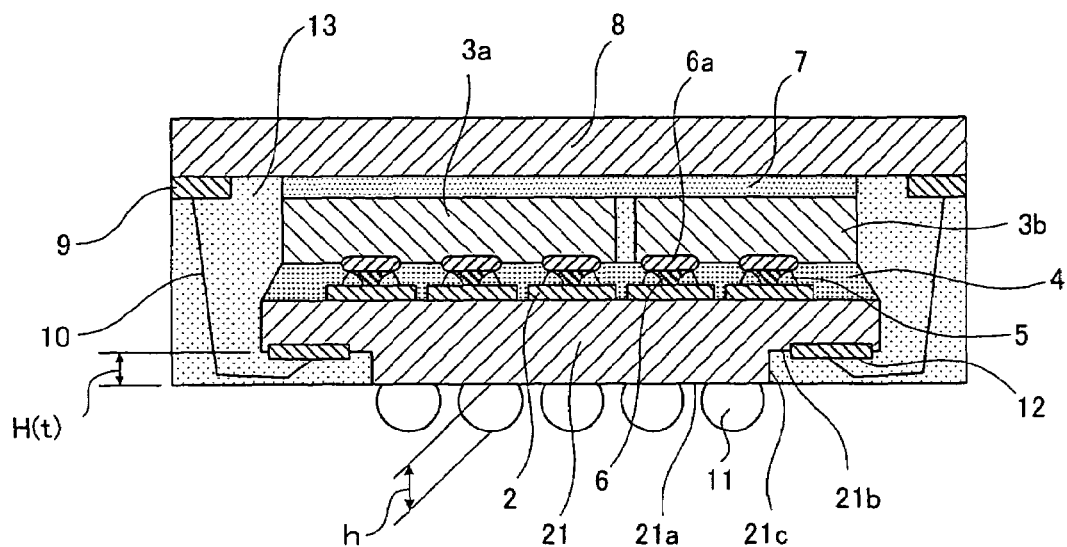
FIG. 7 is a side cross-sectional view of a semiconductor device having a plurality of first semiconductor elements, showing a modified example of the same semiconductor device.

Further, the semiconductor device of the second embodiment may have a plurality of first semiconductor elements 3a and 3b arranged on the one face of the semiconductor carrier 21, as shown in FIG. 7. In this case, in the fabrication method, when the first semiconductor elements 3a and 3b are stacked on the one face of the semiconductor carrier 1 by means of flip-chip bonding (step B), the first semiconductor element 3a and first semiconductor element 3b are individually joined to the semiconductor carrier 1 with the first semiconductor element 3a being joined first, followed by the first semiconductor element 3b.

Third Embodiment

A third embodiment of the semiconductor device according to the present invention and the fabrication method thereof will now be described with reference to FIGS. 8 to 11. Further, the same reference numerals have been assigned to the same members as those in the first and second embodiments and hence a description of these members is omitted here.

Figure 8:
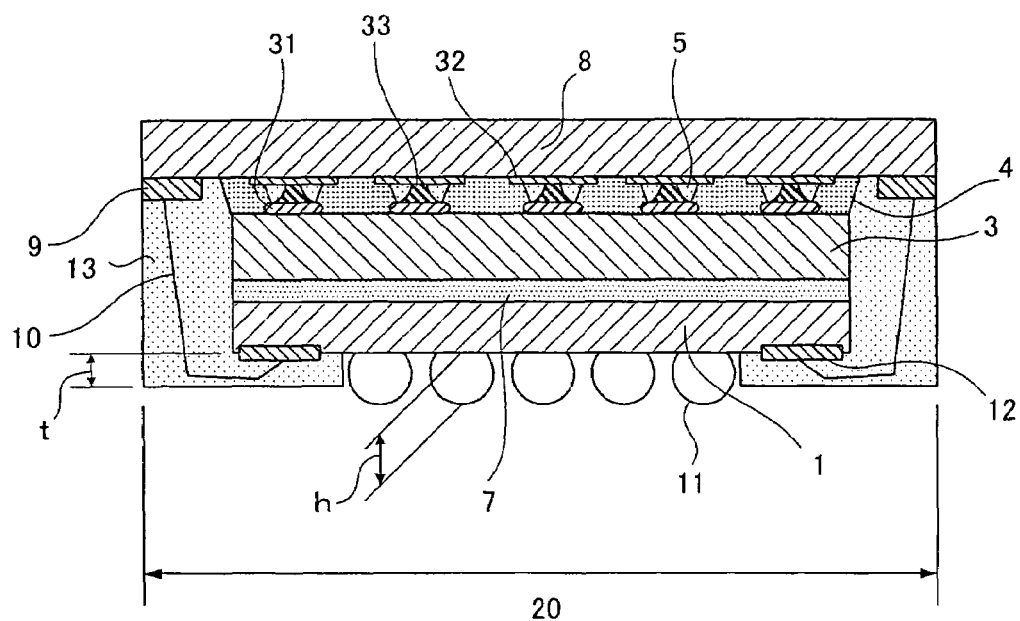
FIG. 8 is a side cross-sectional view showing a third embodiment of the semiconductor device according to the present invention.

As shown in FIG. 8, the first semiconductor element 3 comprises, on the one face thereof (called the upper face in FIG. 8 hereinafter), an electrode face 31, which is a fifth electrode. Further, the second semiconductor element 8 has an electrode face 32, which is a sixth electrode, provided in the middle section of the other face (the lower face in FIG. 8 hereinafter) and bonding pads 9 constituting second electrodes formed on the outer perimeter of the other face.

A bump 33, which is a protruding electrode, is formed on the electrode face 31 of the first semiconductor element 3. Further, the bump 33 of the first semiconductor element 3 is joined to the electrode face 32 of the second semiconductor element 8 via the conductive adhesive 5 by means of flip-chip bonding and the first semiconductor element 3 is stacked on the other face of the second semiconductor element 8. Underfill material 4 is then introduced to the gap that is formed between the first semiconductor element 3 and second semiconductor element 8 and to the periphery thereof, whereby the bump 33 is protected.

The method of connecting the first semiconductor element 3 and second semiconductor element 8 is known as a COC (Chip On Chip) structure and therefore permits a high-speed operation between the first semiconductor element 3 and second semiconductor element 8 because the first semiconductor element 3 and second semiconductor element 8 are electrically connected at a short distance.

Further, the other face of the first semiconductor element 3 and the one face of the semiconductor carrier 1 are joined by means of die-bonding material 7 and then stacked. Further, the bonding pads 9 of the second semiconductor element 8 and the second adhesive layer 12 constituting a fourth electrode provided on the other face of the semiconductor carrier 1 are connected via fine metal wires 10 by means of wire bonding. Further, in order to protect the fine metal wires 10, the insulating sealing resin 13 is made to fill and resin-seal the periphery of the first semiconductor element 3 and the second adhesive layer 12 of the semiconductor carrier 1, and the wiring portion of the fine metal wires 10 from the other side of the second semiconductor element 8 to the semiconductor carrier 1. The sealing resin region 20 for the sealing resin 13 is formed substantially the same as the external dimensions of the second semiconductor element 8.

First fabrication method of the semiconductor device Next, the first fabrication method of the semiconductor device according to the third embodiment will be described with reference to FIGS. 9A to 9F.

Figure 9A:
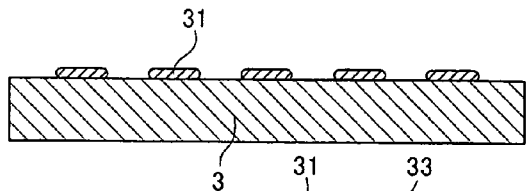

As shown in FIG. 9A, electrode faces 31 are provided on the one face of the first semiconductor element 3. As shown in FIG. 9B, bumps 33 are formed on the electrode faces 31 of the first semiconductor element 3. As the bumps 33, a plated bump or a stud bump for which metal is used can be adopted but a stud bump is employed here.

Figure 9C:
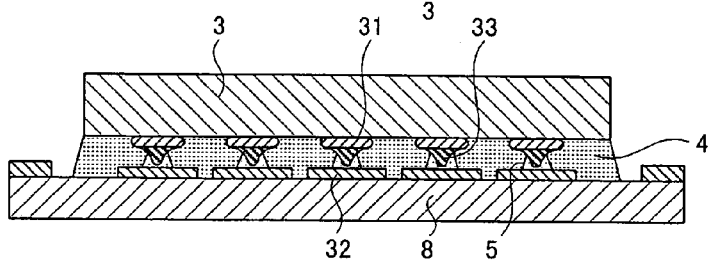

Next, as shown in FIG. 9C, a bump pedestal is provided on the electrode face 32 on the other face of the second semiconductor element 8. Further, after the conductive adhesive 5 has been supplied to the bumps 33, the first semiconductor element 3 and the electrode face 32 of the second semiconductor element 8 are joined by means of flip-chip bonding (step H). In addition, the underfill material 4 is introduced to the gap between the first semiconductor element 3 and second semiconductor element 8 and to the periphery thereof, whereby the bumps 33 are protected (step I).

Figure 9D:
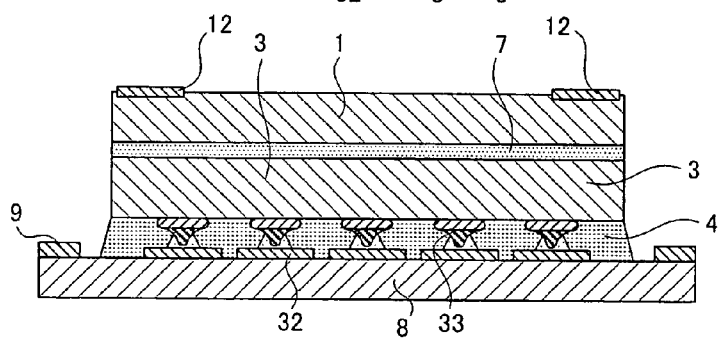

Thereafter, as shown in FIG. 9D, the first semiconductor element 3 is bonded via die-bonding material 7 to the one face of the semiconductor carrier 1 (step J). Here, an insulating paste or insulating sheet, or the like, can be adopted as the die-bonding material 7 but an insulating sheet is used here.

Figure 9E:
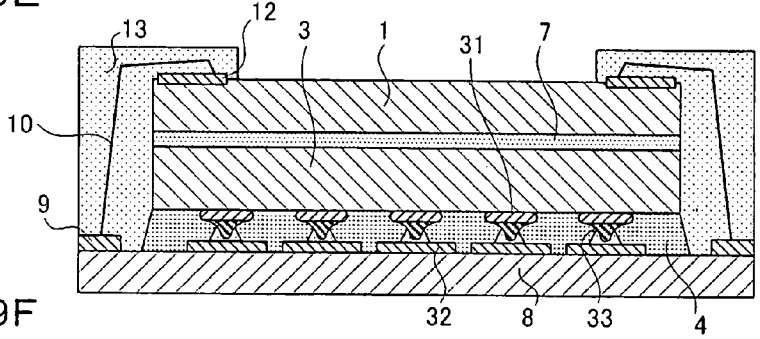

Next, as shown in FIG. 9E, second adhesive layers 12 are formed on the outer perimeter of the other face of a semiconductor carrier 1 and the second adhesive layers 12 and bonding pads 9 of the second semiconductor element 8 are electrically connected via fine metal wires 10 by means of wire bonding (step K). In addition, in order to protect the first semiconductor element 3, second semiconductor element 8 and fine metal wires 10, the sealing resin 13 is made to fill and seal the periphery of the first semiconductor element 3 and semiconductor carrier 1 and the wiring portion of the fine metal wires 10 from the other face of the second semiconductor element 8 to the semiconductor carrier 1 (step L). Here, a sealing fill region (bonding area) 20, which is filled with the sealing resin 13, is formed over substantially the same area as the external dimensions of the second semiconductor element 8.

Figure 9F:
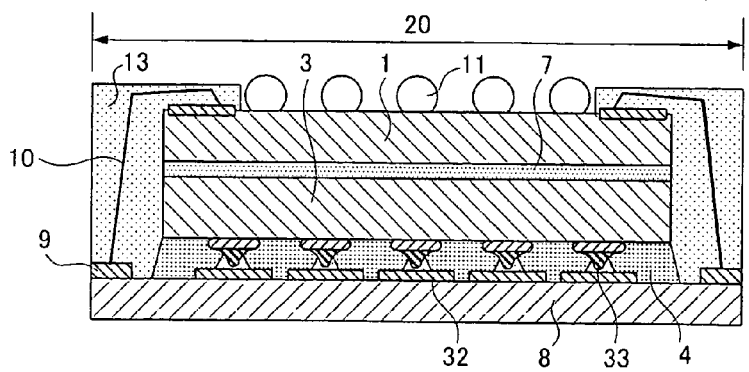

Next, as shown in FIG. 9F, fabrication of the semiconductor device is completed by attaching the external terminal electrodes 11 to the other face of the semiconductor carrier 21.

As a modified example of the first fabrication method above, the order of fabrication may be such that the first semiconductor element 3 is joined to the one face of the semiconductor carrier 1 by means of flip-chip bonding (step H) and underfill material 4 is introduced (step I) after first bonding the first semiconductor element 3 to the semiconductor carrier 1 (step J), that is, the order may be step J, step H, step I, step K, and step L.

(Second Fabrication Method of the Semiconductor Device: Wafer Package Dicing)

The second fabrication method of the semiconductor device according to the second embodiment will now be described with reference to FIGS. 10A to 10D and 11E to 11G.

Figure 10A:
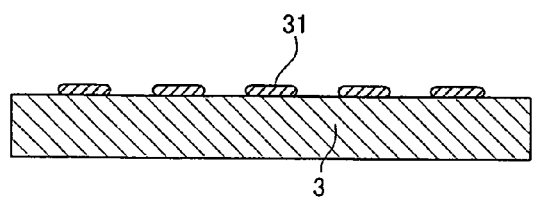
FIGS. 10A to 10D are side cross-sectional views illustrating a second fabrication procedure of the same semiconductor device.
Figure 10B:
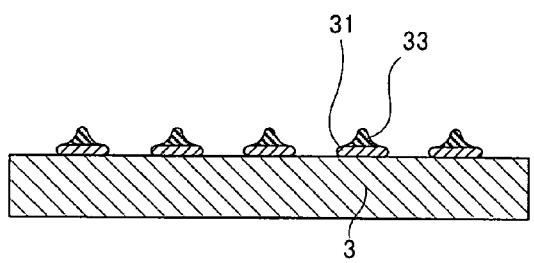

As shown in FIG. 10A, electrode faces 31 constituting fifth electrodes are provided on the one face of the first semiconductor element 3. As shown in FIG. 10B, bumps 33, which are protruding electrodes, are formed on the electrode faces 31.

Figure 10C:
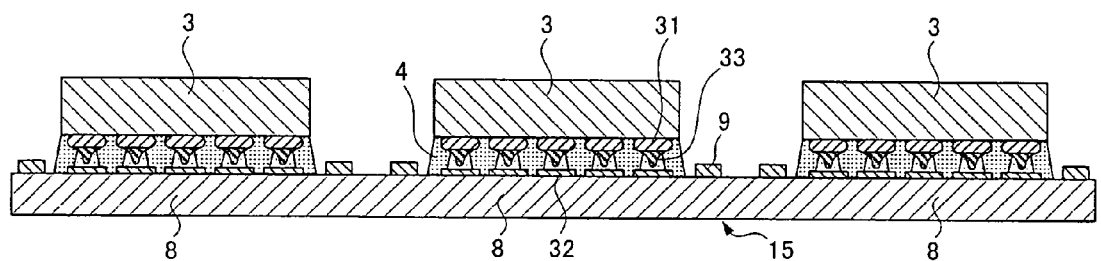

As shown in FIG. 10C, the second semiconductor element 8 is in the state of the wafer substrate 15 (before dicing) on which a plurality of the second semiconductor elements 8 is integrally formed. The electrode faces 31 of the first semiconductor element 3 are joined via the bumps 33 by means of flip-chip bonding to the electrode faces 32 constituting the sixth electrode faces of each of the second semiconductor elements 8 in the state of the wafer substrate 15 and the first semiconductor elements 3 are each stacked on the second semiconductor elements 8 (step H). In addition, underfill material 4 is introduced to the gap between the first semiconductor element 3 and second semiconductor element 8 and to the periphery thereof, whereby the bumps 33 are protected (step I).

Figure 10D:
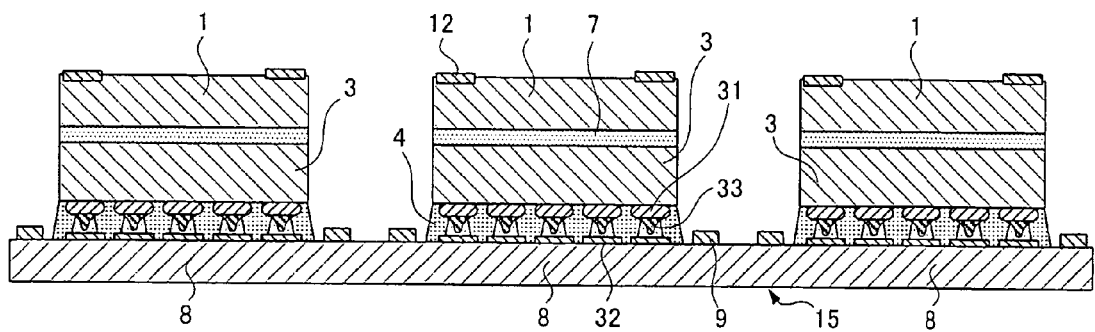

As shown in FIG. 10D, the other face of the first semiconductor element 3 and the one face of the semiconductor carrier 1 are bonded via the die-bonding material 7 and the first semiconductor element 3 and second semiconductor element 8 are stacked on the semiconductor carrier 1 (step J).

As shown in FIG. 1E, the adhesive layer 12 of the semiconductor carrier 1 and the bonding pads 9 of the second semiconductor element 8 are electrically connected via fine metal wires 10 by means of wire bonding (step K).

Figure 11E:
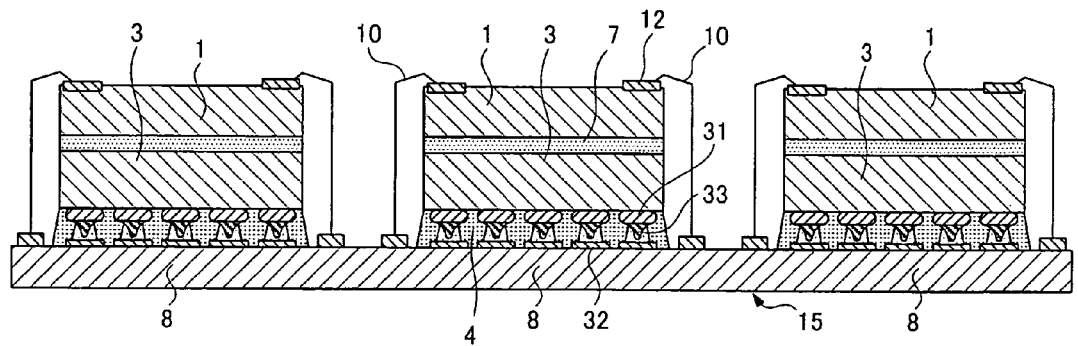
FIGS. 11E to 11G are side cross-sectional views illustrating the second fabrication procedure of the same semiconductor device.
Figure 11F:
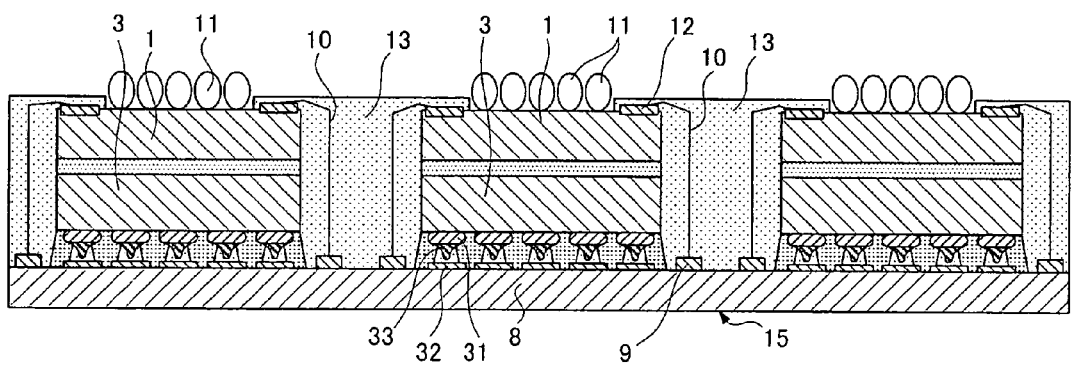

As shown in FIG. 11F, in order to protect the first semiconductor element 3, the second semiconductor element 8 and the fine metal wires 10, sealing resin 13 is made to fill and seal the periphery of the first semiconductor element 3 and semiconductor carrier 1 and the wiring portion of the fine metal wires 10 between the second semiconductor element 8 and semiconductor carrier 1 (step L). Next, the external terminal electrodes 11 are mounted.

Figure 11G:
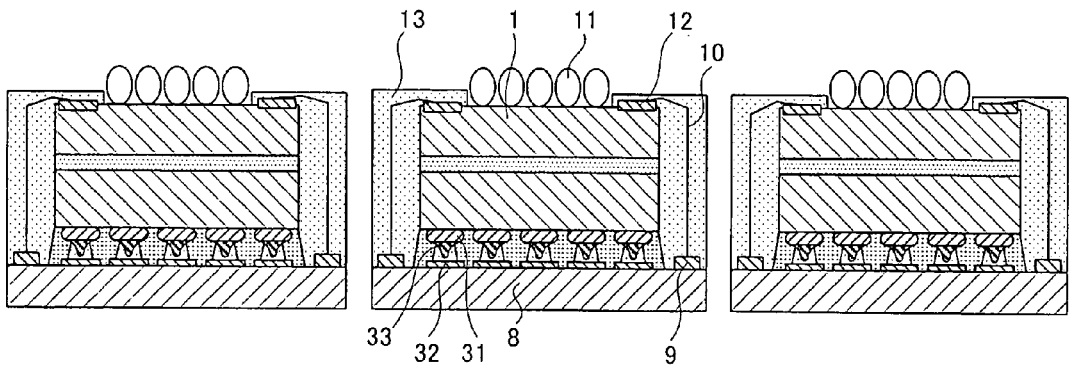

Finally, the resin-sealed wafer substrate 15 is diced by using a blade and the semiconductor devices are separated (step N). The individual semiconductor devices are thus fabricated as shown in FIG. 11G.

According to the second fabrication method, a plurality of the semiconductor devices can be fabricated by performing together the flip-chip bonding step (step H), the underfill material introduction step (step I), the die-bonding step (step J), the wire bonding step (step K), the resin sealing step (step L), and the dicing step (step N), which permits efficient fabrication.

Here, as shown in FIG. 8, in order to achieve a favorable connection between the external terminal electrodes 11 and the outside, the thickness:t of the sealing resin 13, which protects the fine metal wires 10 and second adhesive layer 12, is formed thinner than the mounting height:h of the external terminal electrodes 11. This is because, when the thickness:t of the sealing resin 13 is greater than the height:h of the external terminal electrodes 11, the thickness:t of the sealing resin 13 is an obstacle during mounting, which hinders the connection of the external terminal electrodes 11.

According to the third embodiment above, the same operating results as those of the first embodiment are afforded and the first semiconductor element 3 and second semiconductor element 8 are connected by means of flip-chip bonding and then stacked, whereby high-speed operation between the semiconductor elements 3 and 8 is possible. Further, according to the fabrication method above, a stacked-body semiconductor device that affords the same operating results as the semiconductor device of the first embodiment can be fabricated. Further, the first semiconductor element 3 and second semiconductor element 8 are connected by means of flip-chip bonding. Hence, the semiconductor device, which permits a high-speed operation between the semiconductor elements 3 and 8, is provided.

Figure 12:
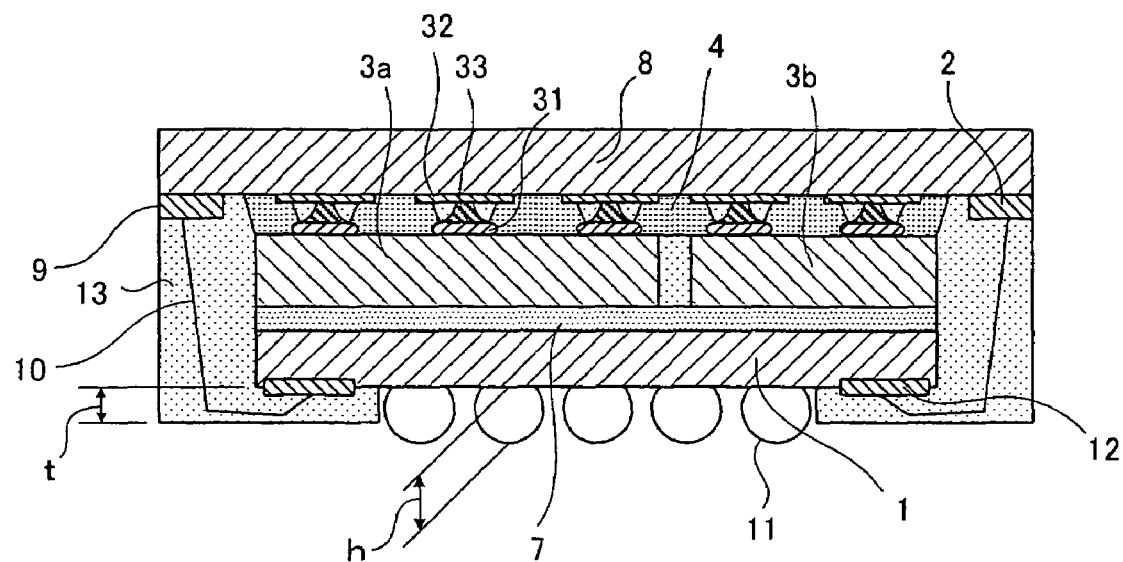
FIG. 12 is a side cross-sectional view of a semiconductor device having a plurality of first semiconductor elements, showing a modified example of the same semiconductor device.

Further, as shown in FIG. 12, a plurality of first semiconductor elements 3a and 3b is arranged on the one face of the semiconductor carrier 1.

Fourth Embodiment

Figure 13:
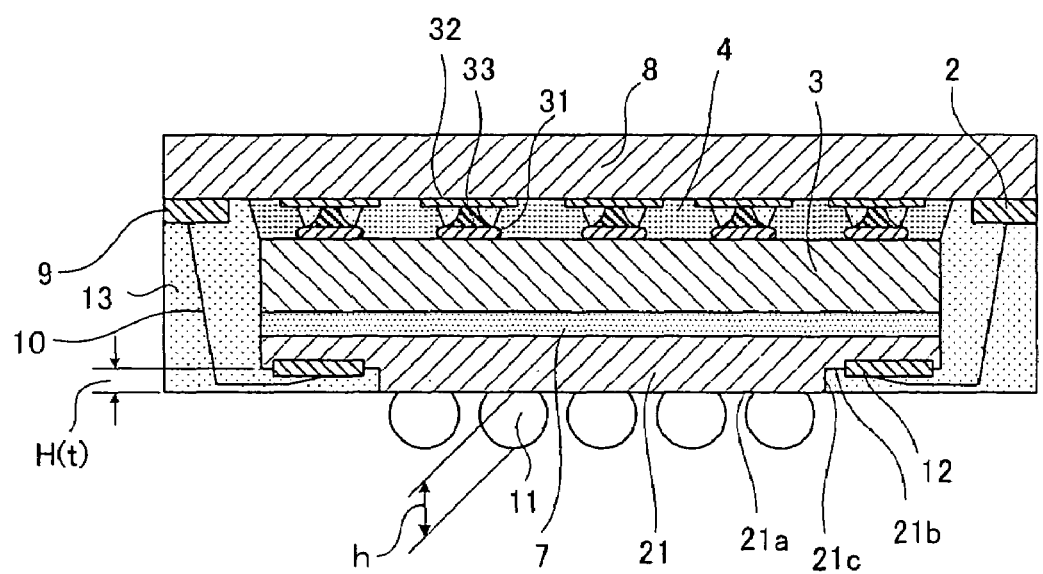
FIG. 13 is a side cross-sectional view of a fourth embodiment of the semiconductor device according to the present invention.

A fourth embodiment of the semiconductor device according to the present invention and the fabrication method thereof will now be described with reference to FIG. 13. Further, the same reference numerals have been assigned to the same members as those of the first to third embodiments and therefore a description of these members is omitted here.

A semiconductor carrier 21 has a protruding face 21a, which comprises external terminal electrodes 11, formed on the other face of the semiconductor carrier 21 and a backward face 21b, which is formed via a step 21c on the protruding face 21a and has a second adhesive layer 12. The semiconductor device can be fabricated by means of the same method as that of the third embodiment.

In addition to the effects of the semiconductor device of the third embodiment, the same effects as those of the second embodiment are also afforded by the semiconductor carrier 21, that is, by providing the protruding face 21a with external terminal electrodes 11 on the other face of the semiconductor carrier 21 and the backward face 21b, which is thin on the outer perimeter and has a second adhesive layer 12, the thickness t of the sealing resin 13 can be taken up by the height H. That is, because the thickness:t of the sealing resin 13 that covers the second adhesive layer 12 and protrudes from the protruding face 21a is reduced by the height:H from the backward face 21b to the protruding face 21a, individual effects, such as there being no restrictions on the mounting height h of the external terminal electrodes 11 can be afforded.

Figure 14:
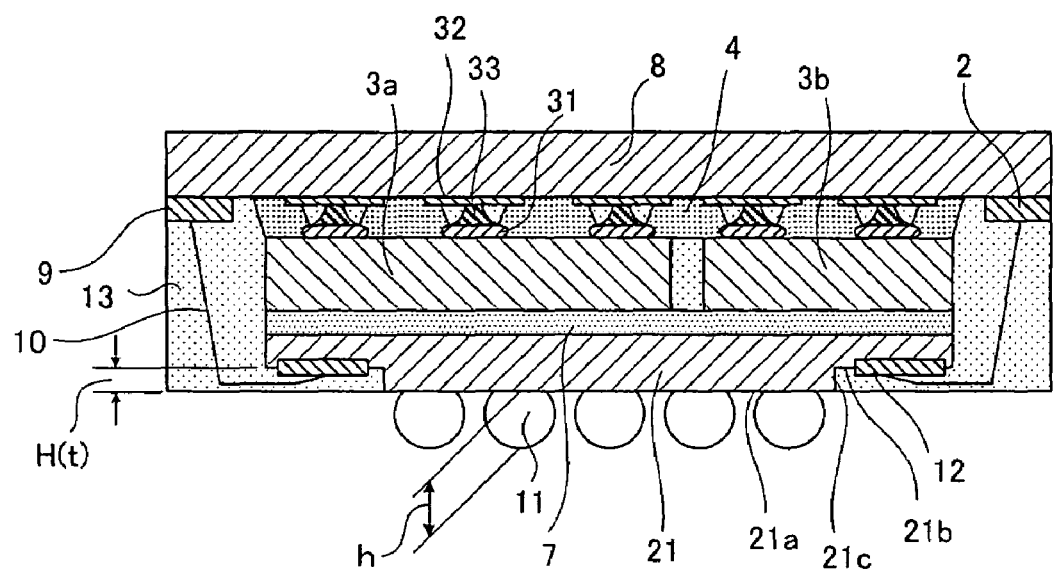
FIG. 14 is a side cross-sectional view of a semiconductor device having a plurality of first semiconductor elements, showing a modified example of the same semiconductor device.

Further, as shown in FIG. 14, a plurality of first semiconductor elements 3a and 3b may be arranged on the one face of the semiconductor carrier 21.

Fifth Embodiment

A fifth embodiment of the semiconductor device according to the present invention and the fabrication method thereof will now be described with reference to FIGS. 15 to 17. The fifth embodiment uses a tape carrier 41 in place of the semiconductor carrier 1 of the first to fourth embodiments. Further, the same reference numerals have been assigned to the same members of the first to fourth embodiments and, hence, a description of these members is omitted here.

Figure 15:
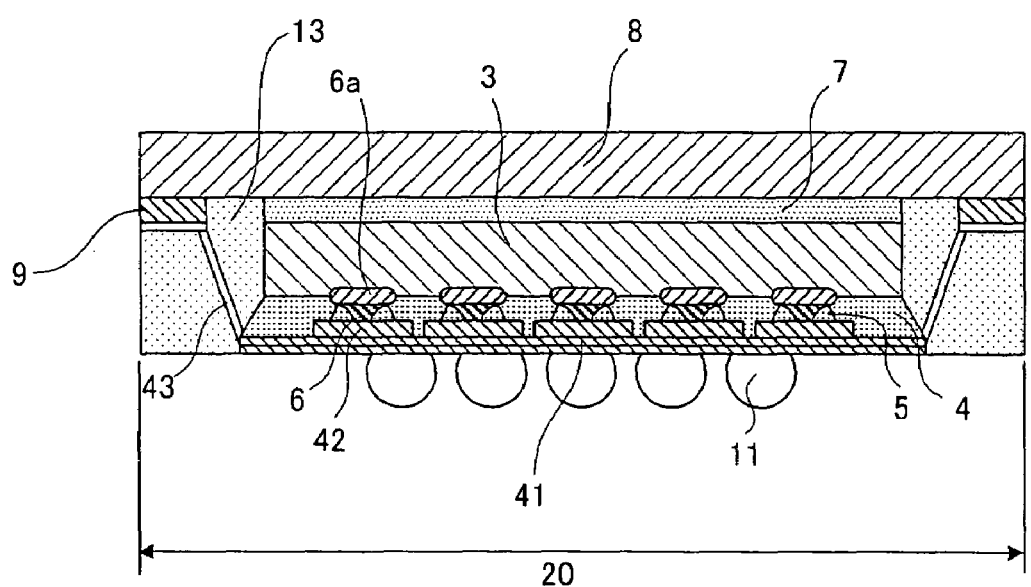
FIG. 15 is a side cross-sectional view of a fifth embodiment of the semiconductor device according to the present invention.

As shown in FIG. 15, bumps 6 are formed on electrodes 6a constituting first electrodes that are provided on the other face of the first semiconductor element 3 (called the lower face in FIG. 15 hereinafter). The bumps 6 of the first semiconductor element 3 are joined via a conductive adhesive 5 to an adhesive layer 42 constituting a seventh electrode 7 provided on the one face (called the upper face in FIG. 15 hereinafter) of the tape carrier 41 by means of flip-chip bonding. As a result, the first semiconductor element 3 is stacked on the one face of the tape carrier 41. Further, the underfill material 4 is introduced to the gap that is formed between the first semiconductor element 3 and tape carrier 41 and to the periphery thereof, whereby the bumps 6 are protected.

The other face of the second semiconductor element 8 is bonded via die-bonding material 7 to the one face of the first semiconductor element 3 and the second semiconductor element 8 is stacked on the one face of the first semiconductor element 3. In addition, inner leads 43, which are integrally formed on the tape carrier 41, are electrically connected to bonding pads 9 constituting second electrodes on the surface of the second semiconductor element 8. Thereafter, sealing resin 13 is made to fill the periphery of the first semiconductor element 3 and the wiring portion of the inner leads 43 from the other face of the second semiconductor element 8 to the tape carrier 41, and the first semiconductor element 3, second semiconductor element 8, and inner leads 43 are protected by the sealing resin 13. A sealing fill region (bonding area) 20, which is filled with the sealing resin 13, is formed over substantially the same area as the external dimensions of the second semiconductor element 8. Further, the external terminal electrodes 11, which conduct to an adhesive layer 42 or inner leads 43, are formed on the other face of the tape carrier 41.

(First Fabrication Method of the Semiconductor Device)

The first fabrication method of the semiconductor device according to the fifth embodiment will be described with reference to FIGS. 16A to 16F.

Figure 16A:
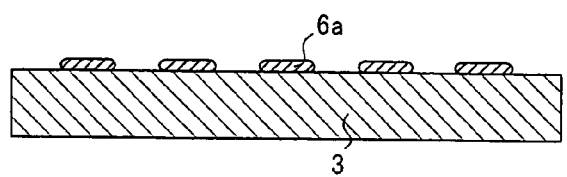
FIGS. 16A to 16F are side cross-sectional views illustrating the first fabrication procedure of the same semiconductor device.
Figure 16B:
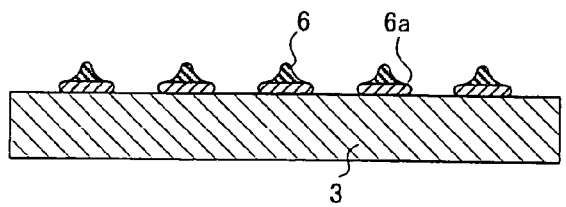

As shown in FIG. 16A, electrodes 6a are provided on the other face of the first semiconductor element 3. As shown in FIG. 16B, bumps 6 constituting protruding electrodes are formed on the electrodes 6a. As the bump 6, a plated bump or stud bump, for which metal is used, can be adopted but a stud bump is employed here.

Figure 16C:
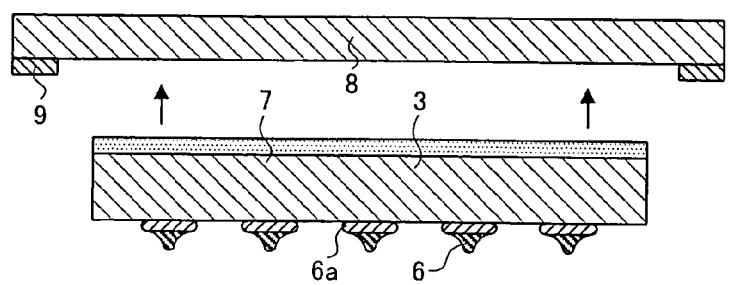

As shown in FIG. 16C, the one face of the first semiconductor element 3 and the other face of the second semiconductor element 8 are bonded via the die-bonding material 7 and the first semiconductor element 3 and second semiconductor element 8 are stacked (step O). Here, an insulating paste or an insulating sheet, or the like, can be adopted as the die-bonding material 7 but an insulating sheet is employed here.

Figure 16D:
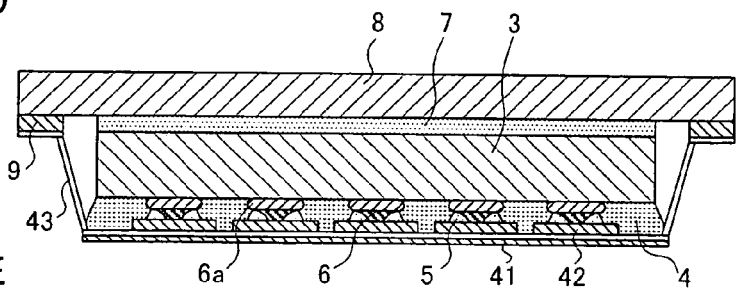

As shown in FIG. 16D, the bumps 6 of the electrodes 6a of the first semiconductor element 3 and the adhesive layers 42 of the tape carrier 41 are joined by means of flip-chip bonding and the first semiconductor element 3 and second semiconductor element 8 are stacked on the tape carrier 41 (step P). Thereafter, underfill material 4 is introduced to the gap between the first semiconductor element 3 and tape carrier 41 and to the periphery thereof, whereby the bumps 6 are protected (step Q). In addition, the inner leads 43 of the tape carrier 41 are connected to the bonding pads 9 of the second semiconductor element 8 such that the second semiconductor element 8 and tape carrier 41 are electrically connected (step R).

Figure 16E:
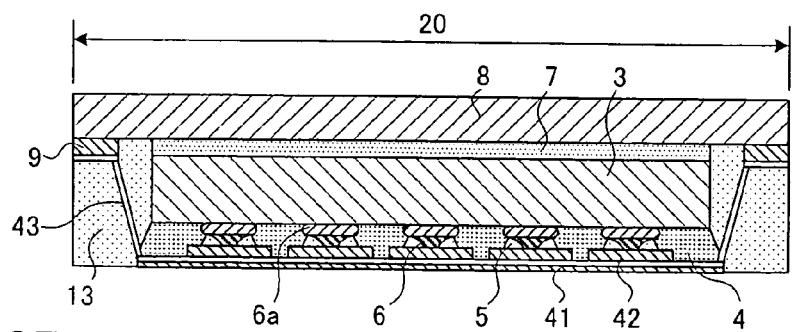

As shown in FIG. 16E, in order to protect the first semiconductor element 3, second semiconductor element 8, and inner leads 43, sealing resin 13 is made to fill and seal the periphery of the first semiconductor element 3 and the wiring portion of the inner leads 43 from the other face of the second semiconductor element 8 to the tape carrier 41 (step S). Here, the sealing fill region 20 for the sealing resin 13 is formed over substantially the same area as the external dimensions of the second semiconductor element 8.

Figure 16F:
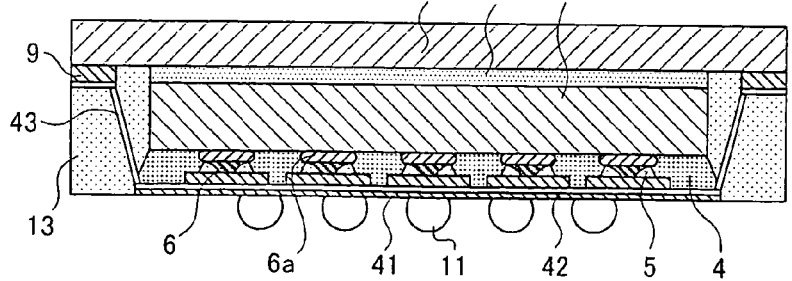

Finally, as shown in FIG. 16F, the external terminal electrodes 11 are attached to the other face of the tape carrier 41, whereby the fabrication of the semiconductor device is completed.

(Second Fabrication Method of the Semiconductor Device: Wafer Package Dicing)

The second fabrication method of the semiconductor device according to the fifth embodiment will now be described with reference to FIGS. 17A to 17F.

Figure 17A:
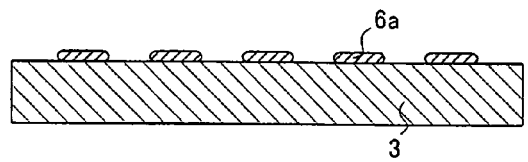
FIGS. 17A to 17F are side cross-sectional views illustrating the second fabrication procedure of the same semiconductor device.
Figure 17B:
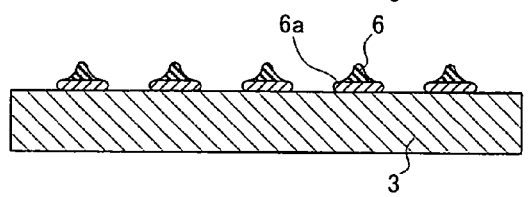
Figure 17C:
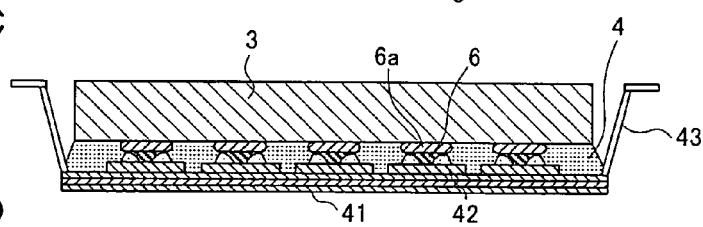

As shown in FIG. 17A, the electrodes 6a are provided on the other face of the first semiconductor element 3. As shown in FIG. 17B, bumps 6 constituting protruding electrodes are formed on the electrodes 6a. As shown in FIG. 17C, the bumps 6 of the electrodes 6a of the first semiconductor element 3 and the adhesive layers 42 of the one face of the tape carrier 41 are joined by means of flip-chip bonding and the first semiconductor element 3 and tape carrier 41 are stacked (step P). In addition, underfill material 4 is introduced to the gap between the first semiconductor element 3 and tape carrier 41 and to the periphery thereof, whereby the bumps 6 are protected (step Q).

Figure 17D:
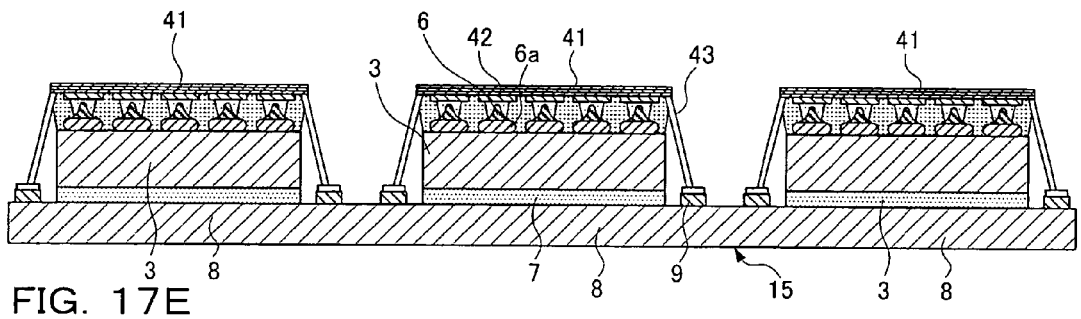

As shown in FIG. 17D, the second semiconductor element 8 is in the state of wafer substrate 15 (before dicing) on which a plurality of second semiconductor elements 8 is integrally formed, and the one face of the first semiconductor element 3 is bonded via the die-bonding material 7 to the other face of each of the semiconductor elements 8 in the state of the wafer substrate 15 (step O). Thereafter, the inner leads 43 of the tape carrier 41 are connected to the bonding pads 9 of the second semiconductor element 8 and the tape carrier 41 and second semiconductor element 8 are electrically connected (step R).

Figure 17E:
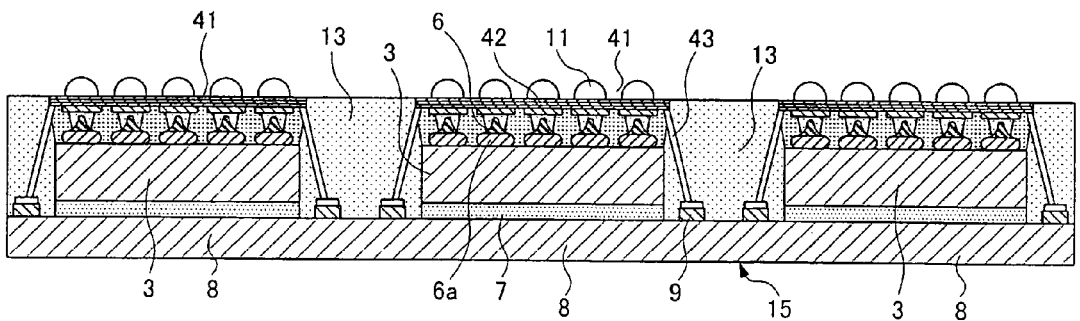

As shown in FIG. 17E, in order to protect the first semiconductor element 3, the second semiconductor element 8, and inner leads 43, sealing resin 13 is made to fill and seal the periphery of the first semiconductor element 3 and the wiring portion of the inner leads 43 from the other face of the second semiconductor element 8 to the tape carrier 41 (step S), whereupon the external terminal electrodes 11 are attached to the other face of the tape carrier 41.

Figure 17F:
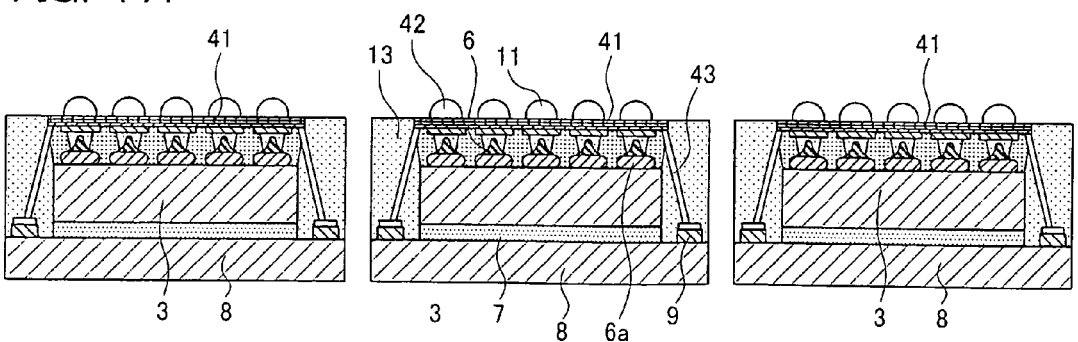

As shown in FIG. 17F, the resin-sealed wafer substrate 15 is diced by means of a blade and the individual semiconductor devices are produced, whereby fabrication is completed (step T).

By using these fabrication steps, a plurality of the semiconductor devices can be fabricated by performing together a bonding step, a resin-sealing step and a dicing step, which permits efficient fabrication.

According to the semiconductor device of the fourth embodiment above, a thinner semiconductor device can be provided in comparison with the first and second embodiments by changing the semiconductor carrier 1 to the tape carrier 41 and using the inner leads 43 in place of the fine metal wires 10. In particular, because the inner leads 43 are integrally extended from the tape carrier 41 and connected to the bonding pads 9 of the second semiconductor element 8, there are no protrusions on the other face of the tape carrier 41. That is, according to a first conventional example of the semiconductor device, fine metal wires 60 on the first semiconductor element 53 and sealing resin 63, which covers and protects the fine metal wires 60, are on the other face of the semiconductor carrier 1 and this thickness is required. In comparison with the first conventional example, the semiconductor device of the fourth embodiment can be made thinner because the thickness of the fine metal wires 10 and sealing resin 13 on the other face of the tape carrier 41 is lost. For example, supposing that the height of the fine metal wires 60 of the first embodiment is 100 μm, for example, the thickness of the sealing resin 63 protecting the fine metal wires 60 must be 20 μm. As a result, the semiconductor device of the fourth embodiment can be made thinner in an amount corresponding to the thickness 200 μm.

Figure 18:
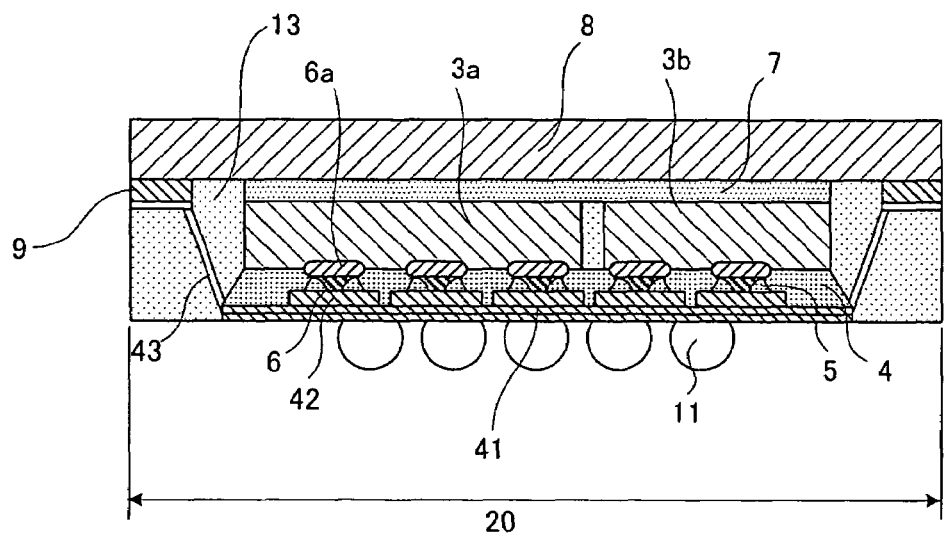
FIG. 18 is a side cross-sectional view of a semiconductor device having a plurality of first semiconductor elements, showing a modified example of the same semiconductor device.

Further, as shown in FIG. 18, in the case of the semiconductor device, the constitution may be such that a plurality of first semiconductor elements 3 may be arranged in the plane of a tape carrier 81.

Sixth Embodiment

A sixth embodiment of the semiconductor device according to the present invention and the fabrication method thereof will now be described with reference to FIGS. 19 to 21. Further, the same reference numerals have been assigned to the same members as those in the first to fifth embodiments and hence a description of these members is omitted here.

Figure 19:
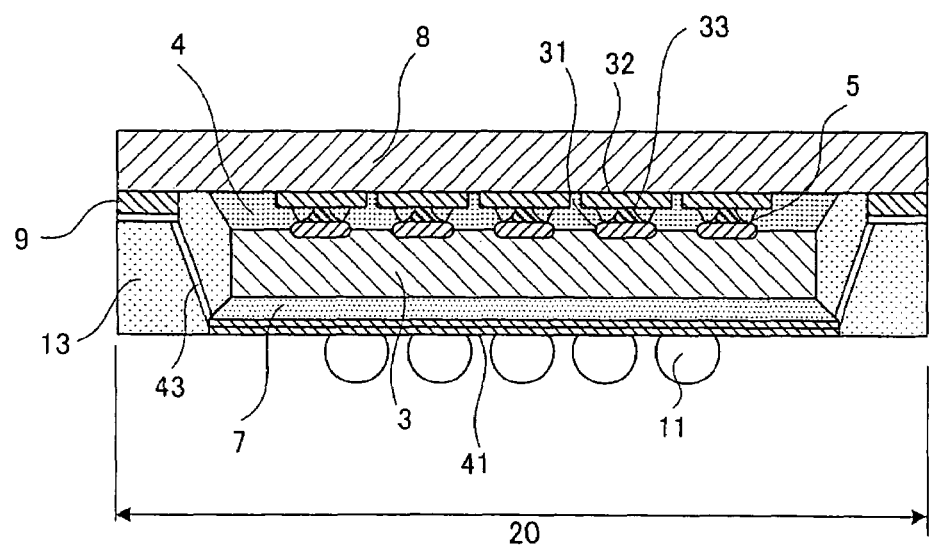
FIG. 19 is a side cross-sectional view of a sixth embodiment of the semiconductor device according to the present invention.

As shown in FIG. 19, the bump 33 constituting a protruding electrode is formed on the electrode face 31 constituting a fifth electrode provided on the one face (referred to as the upper face in FIG. 19 hereinafter) of the first semiconductor element 3. Further, the electrode face 32 constituting the sixth electrode is provided in the middle section of the other face (referred to as the lower face in FIG. 19 hereinafter) of the second semiconductor element 8. In addition, the bonding pads 9 constituting second electrodes are formed on the outer perimeter of the other face of the second semiconductor element 8.

The bump 33 is formed on the electrode face 31 of the first semiconductor element 3. The bump 33 is joined to the electrode face 32 of the second semiconductor element 8 via the conductive adhesive 5 by means of flip-chip bonding and the second semiconductor element 8 is stacked on the first semiconductor element 3. Thereafter, underfill material 4 is introduced to the gap that is formed between the first semiconductor element 3 and second semiconductor element 8 and to the periphery thereof, whereby the bump 33 is protected.

The method of connecting the first semiconductor element 3 and second semiconductor element 8 is known as the COC (Chip On Chip) structure and accordingly permits a high-speed operation between the semiconductor elements 3 and 8.

Thereafter, the one face of the tape carrier 41 and the other face of the first semiconductor element 3 are joined by means of die-bonding material 7 and the tape carrier 41 and first semiconductor element 3 are stacked. In addition, inner leads 43, which are integrally formed on the tape carrier 41, are electrically connected to the bonding pads 9 of the second semiconductor element 8. Thereafter, sealing resin 13 is made to fill the periphery of the first semiconductor element 3 and the wiring portion of the inner leads 43 from the second semiconductor element 8 to the tape carrier 41, whereby the first semiconductor element 3, second semiconductor element 8, and inner leads 43 are protected. A sealing fill region (bonding area) 20, which is filled with sealing resin 13, is formed over an area that is substantially the same as the external dimensions of the second semiconductor element 8.

(First Fabrication Method)

The first fabrication method of the semiconductor device according to the sixth embodiment will now be described with reference to FIGS. 20A to 20F.

Figure 20A:
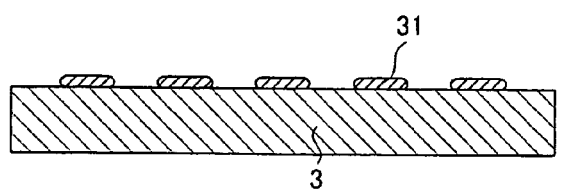
FIGS. 20A to 20F are side cross-sectional views illustrating the first fabrication procedure of the same semiconductor device.
Figure 20B:
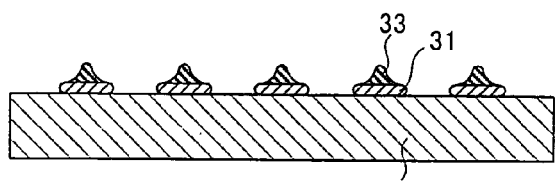

As shown in FIG. 20A, electrodes 31 are provided on the one face of the first semiconductor element 3. As shown in FIG. 20B, bumps 33 are formed on the electrodes 31. Plated bumps or stud bumps for which metal is used can be adopted as the bumps 33 but stud bumps are employed here.

Figure 20C:
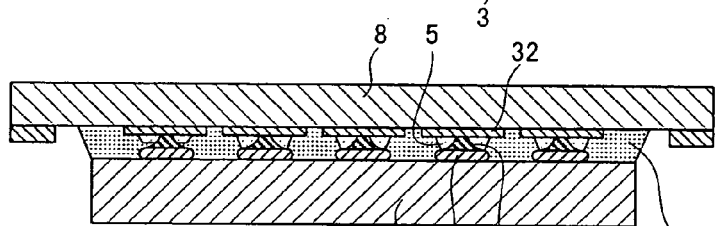

As shown in FIG. 20C, a bump pedestal is provided on the electrode face 32 of the second semiconductor element 8. The bump 33 is then supplied with a conductive adhesive 5, the electrode face 31 of the first semiconductor element 3 and the bump pedestal of the electrode face 32 of the second semiconductor element 8 are joined by means of flip-chip bonding, and the first semiconductor element 3 and second semiconductor element 8 are stacked (step U). In addition, underfill material 4 is introduced to the gap between the first semiconductor element 3 and second semiconductor element 8 and to the periphery thereof, whereby the bump 33 is protected (step V).

Figure 20D:
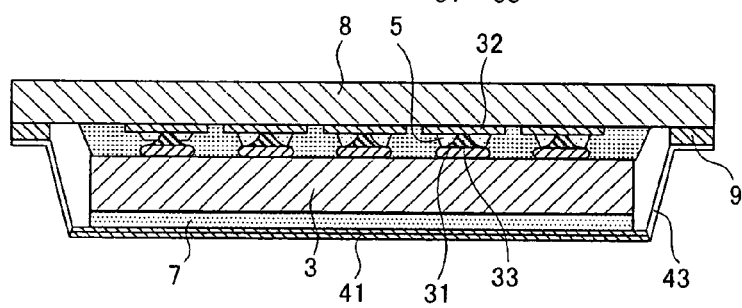

As shown in FIG. 20D, the tape carrier 41 is bonded via the die-bonding material 7 to the other face of the first semiconductor element 3 (step W). Here, an insulating paste, an insulating sheet, or the like, can be adopted as the die-bonding material 7 but an insulating sheet is used here. Further, the inner leads 43 of the tape carrier 41 are connected to the bonding pads 9 of the second semiconductor element 8 such that the second semiconductor element 8 and tape carrier 41 are electrically connected (step X).

Figure 20E:
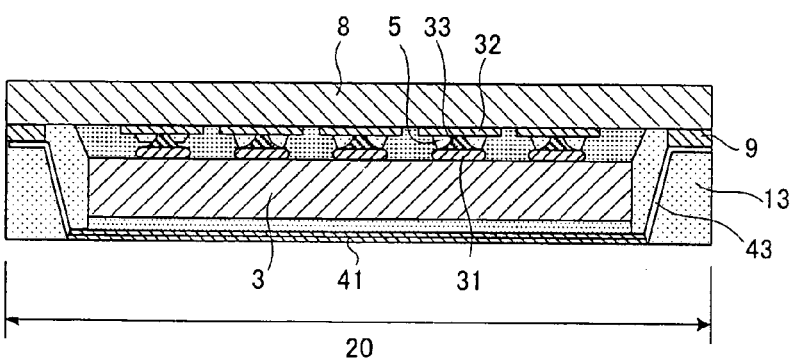

As shown in FIG. 20E, in order to protect the first semiconductor element 3, second semiconductor element 8, and inner leads 43, sealing resin 13 is made to fill and seal the periphery of the first semiconductor element 3 and the wiring portion of the inner leads 43 from the other face of the second semiconductor element 8 to the tape carrier 41. Here the sealing fill region 20 for the sealing resin 13 is formed over substantially the same area as the external dimensions of the second semiconductor element 8 (step Y).

Figure 20F:
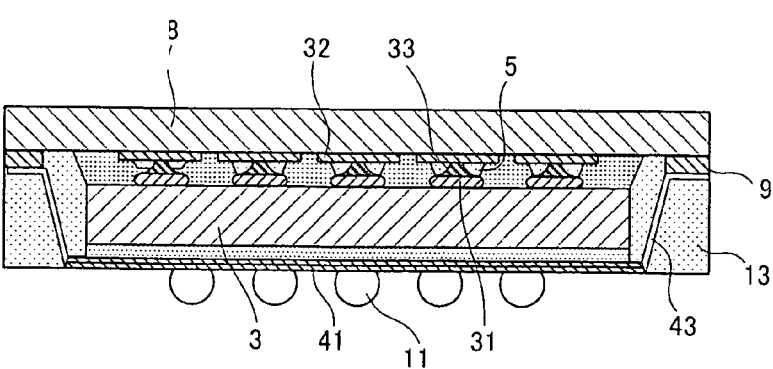

Finally, as shown in FIG. 20F, the external terminal electrodes 11 are attached to the other face of the tape carrier 41, whereby fabrication of the semiconductor device is completed.

Second Fabrication Method of the Semiconductor Device: Wafer Package Dicing

The second fabrication method of the semiconductor device according to the sixth embodiment will now be described with reference to FIGS. 21A to 21F.

Figure 21A:
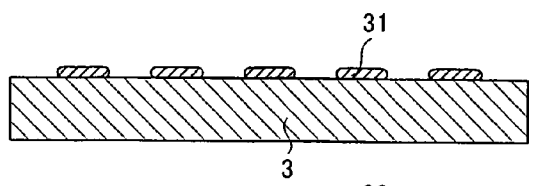
FIGS. 21A to 21F are side cross-sectional views illustrating the second fabrication procedure of the same semiconductor device.

As shown in FIG. 21A, the electrode 31 is provided on the one face of the first semiconductor element 3.

Figure 21B:
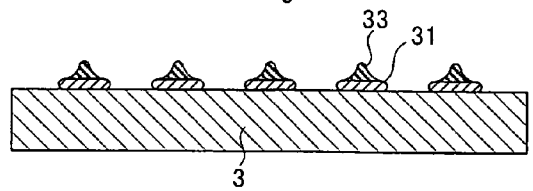
Figure 21C:
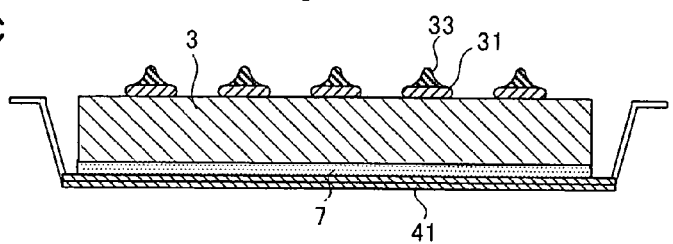

As shown in FIG. 21B, the bump 33 is formed on the electrode face 31. As shown in FIG. 21C, the tape carrier 41 is bonded via the die-bonding material 7 to the other face of the first semiconductor element 3 (step W).

Figure 21D:
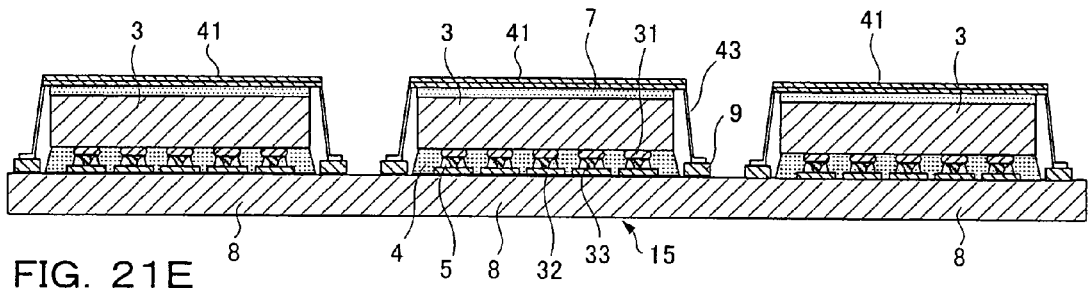

As shown in FIG. 21D, the second semiconductor element 8 is in the state of wafer substrate 15 (before dicing) on which a plurality of the second semiconductor elements 8 is integrally formed. The electrode faces 32 of each of the second semiconductor elements 8 in the state of the wafer substrate 15 and bumps 33 of the electrode faces 31 of the first semiconductor element 3 are joined via a conductive adhesive 5 by means of flip-chip bonding and the first semiconductor elements 3 are each stacked on respective second semiconductor elements 8 (step U). Further, underfill material 4 is introduced between the first semiconductor element 3 and second semiconductor element 8, whereby bumps 33 are protected (step V). In addition, the inner leads 43 of the tape carrier 41 are connected to the bonding pads 9 of the second semiconductor element 8 such that the tape carrier 41 and second semiconductor element 8 are electrically connected (step X).

Figure 21E:
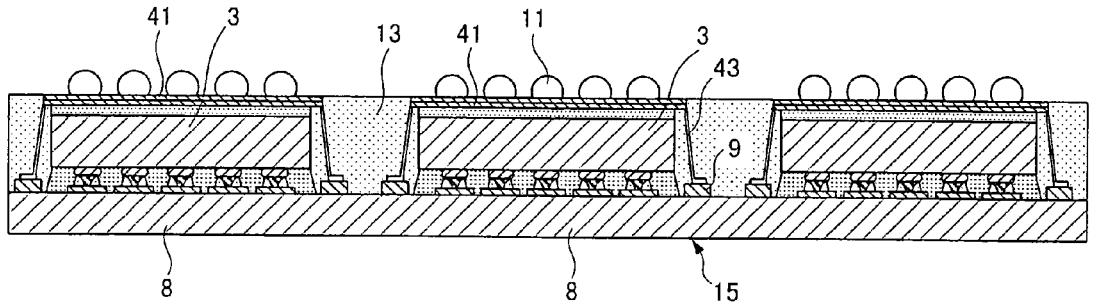

As shown in FIG. 21E, sealing resin 13 is made to fill and seal between the second semiconductor element 8 and tape carrier 41 and the periphery thereof. External terminal electrodes 11 are also attached to the tape carrier 41 (step Y).

Figure 21F:
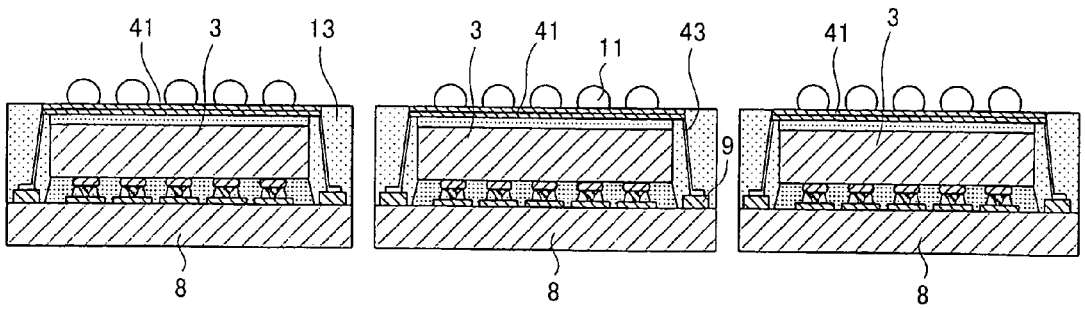

As shown in FIG. 21F, the wafer substrate 15 is diced by using a blade and individual semiconductor devices are produced, whereby fabrication of the semiconductor device is completed (step Z).

By using these fabrication steps, a plurality of the semiconductor devices can be fabricated by performing together the flip-chip bonding step (step U), the underfill material introduction step (step V), the lead connection step (step X), the resin-sealing step (step Y), and the dicing step (step Z), which permits efficient fabrication.

According to the above constitution, in comparison with the first and second embodiments, by using the inner leads 43 in place of the fine metal wires 10 and changing the semiconductor carrier 1 to the tape carrier 41, a thinner-type semiconductor device can be provided. In particular, because the inner leads 43 are integrally extended from the tape carrier 41 and connected to the bonding pads 9 of the second semiconductor element 8, the semiconductor device is constituted such that, not only are there are no protrusions on the other face of the tape carrier 41, which permits a thinner semiconductor device, but implementation of a constitution that is also externally simple is also possible and the mounting height h of the external terminal electrodes 11 can be reduced. Further, because the first semiconductor element 3 and second semiconductor element 8 have a COC (Chip On Chip) structure, a high-speed operation between the first semiconductor element 3 and second semiconductor element 8 is permitted.

Figure 22:
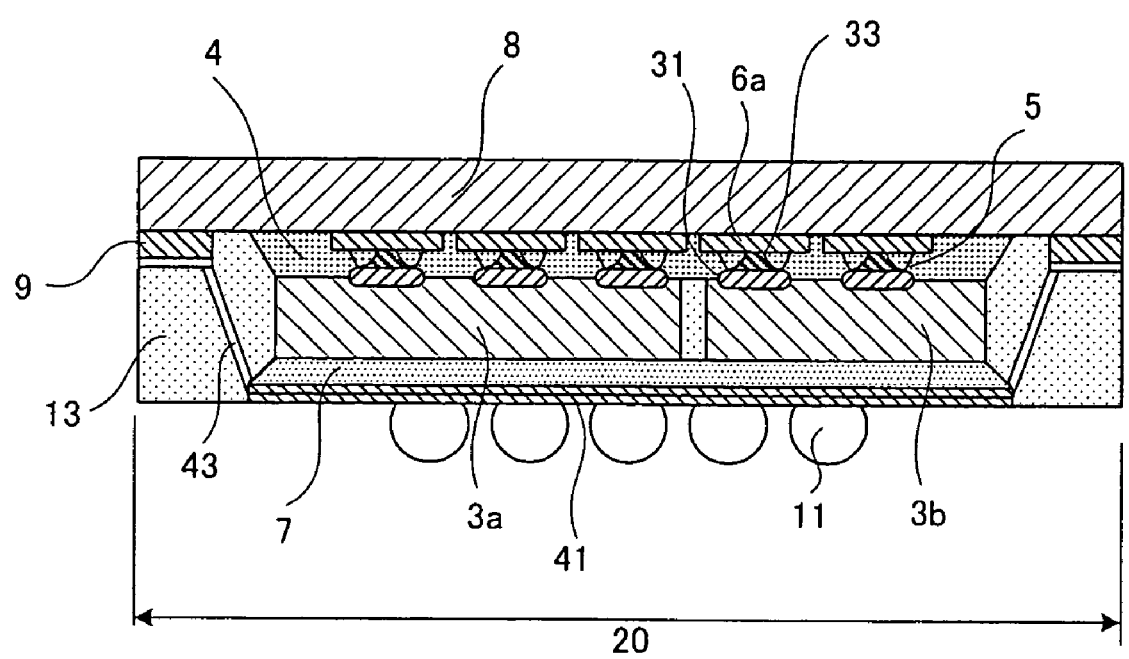
FIG. 22 is a side cross-sectional view of the semiconductor having a plurality of first semiconductor elements, showing a modified example of the same semiconductor device.
Figure 23A:
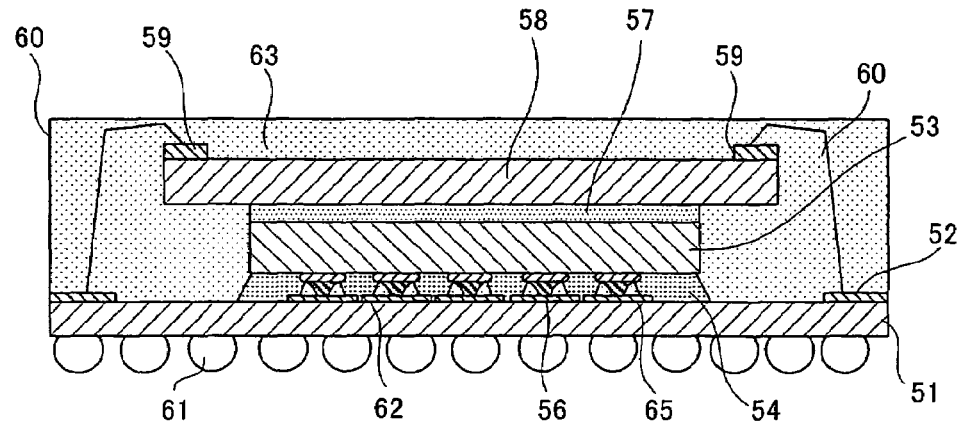
FIG. 23A is a side cross-sectional view of a first conventional semiconductor device.
Figure 23B:
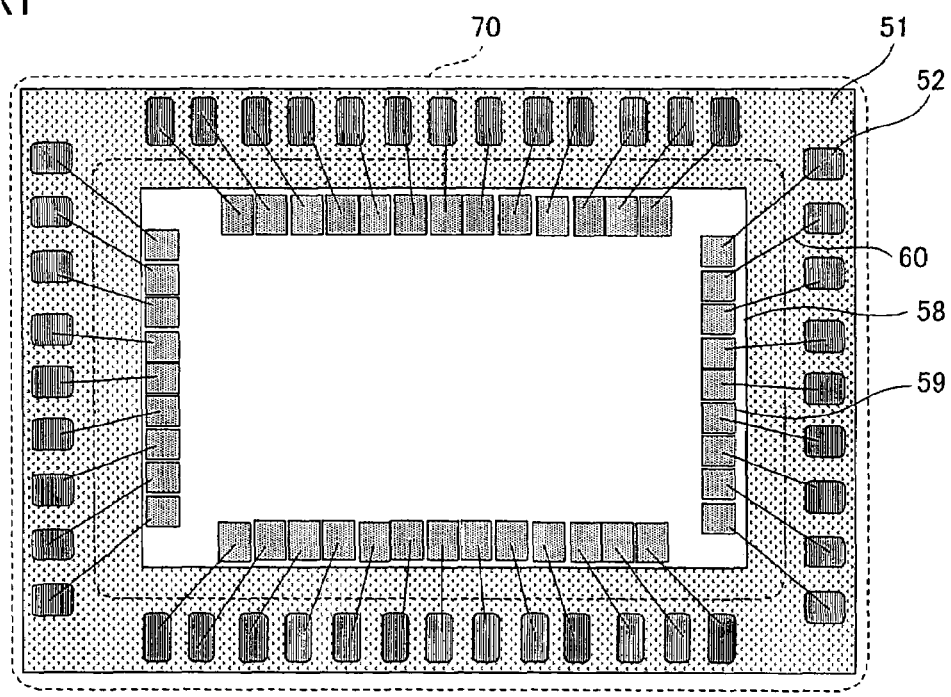
FIG. 23B is a planar cross-sectional view of the first conventional semiconductor device.
Figure 24A:
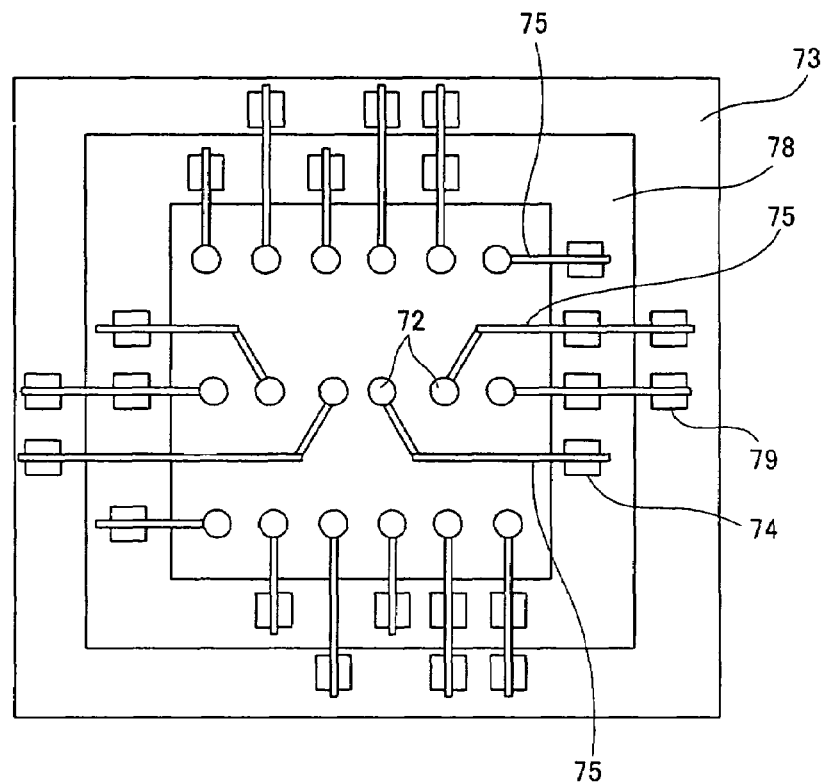
FIG. 24A is a side cross-sectional view of a second conventional semiconductor device.
Figure 24B:
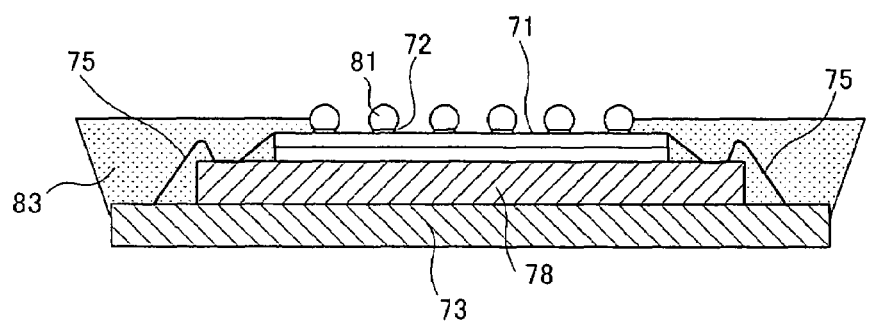
FIG. 24B is a planar cross-sectional view of the second conventional semiconductor device.

Further, as shown in FIG. 22, the semiconductor device may have a constitution in which pluralities of first semiconductor elements 3a and 3b are arranged on the one face of a tape carrier 85.

Furthermore, in the case of the semiconductor devices of all the embodiments above, a highly exothermic power IC can be used as the second semiconductor element 8. This is because the rear face of the second semiconductor element 8 is not resin-sealed and is exposed to the outside, whereby heat can be radiated efficiently. Thus, application is possible even in the case of a semiconductor device that is required to be highly exothermic.

What is claimed is:

1. A semiconductor device, comprising:
    a first semiconductor element that includes a first face and a second face, the first semiconductor element having a first electrode the first face thereof;
    a second semiconductor element that includes a first face and a second face, the second semiconductor element having an outer diameter dimension formed larger than that of the first semiconductor element, the first face of the second semiconductor element being bonded to the second face of the first semiconductor element, and having a second electrode on an outer perimeter of the first face;
    a wiring substrate that includes a first face and a second face, the wiring substrate having a third electrode joined to the first electrode of the first semiconductor element by flip-chip bonding, the third electrode being on the second face of the wiring substrate;
    a fine metal wire connecting a fourth electrode the outer perimeter of the first face of the wiring substrate and the second electrode of the second semiconductor element by wire bonding; and
    an insulating sealing resin for sealing a periphery of the first semiconductor element and a wiring portion of the fine metal wire, between the second semiconductor element and the wiring substrate, wherein
    a sealing fill region for the sealing resin having substantially the same external dimensions of the second semiconductor element.

2. The semiconductor device according to claim 1, wherein an external terminal electrode protrudes from the first face of the wiring substrate, and the external terminal electrode has a height (h) greater than the a thickness (t) of the sealing resin covering the fourth electrode.

3. The semiconductor device according to claim 1, wherein an external terminal electrode is provided protrudingly on the other face of the wiring substrate, the external terminal electrode having a height (h) made to be greater than a thickness (t) of the sealing resin covering the fourth electrode, and a plurality of the first semiconductor elements are provided.

4. The semiconductor device according to claim 1, wherein the external terminal electrode is provided protrudingly on the other face of the wiring substrate, the external terminal electrode having a height (h) made to be greater than a thickness (t) of the sealing resin covering the fourth electrode, and the second semiconductor element is a highly exothermic semiconductor element.

5. The semiconductor device according to claim 1, further comprising on the other face of the wiring substrate:
    a protruding face having the external terminal electrode formed thereon; and
    a backward face formed on the outer perimeter of the protruding face to be thinner than the protruding face and having the fourth electrode formed thereon, the backward face being covered by the sealing resin, wherein
    the thickness of the sealing resin covering the fourth electrode and protruding from the protruding face is reduced by the height (H) from the backward face to the protruding face.

6. The semiconductor device according to claim 1, further comprising on the other face of the wiring substrate:
    a protruding face having the external terminal electrode formed thereon; and
    a backward face formed on the outer perimeter of the protruding face to be thinner than the protruding face and having the fourth electrode formed thereon, the backward face being covered by the sealing resin, wherein
    the thickness of the sealing resin covering the fourth electrode and protruding from the protruding face is reduced by the height (H) from the backward face to the protruding face, and
    a plurality of the first semiconductor elements are provided.

7. The semiconductor device according to claim 1, further comprising on the other face of the wiring substrate:
    a protruding face having the external terminal electrode formed thereon; and
    a backward face formed on the outer perimeter of the protruding face to be thinner than the protruding face and having the fourth electrode formed thereon, the backward face being covered by the sealing resin, wherein
    the thickness of the sealing resin covering the fourth electrode and protruding from the protruding face is reduced by the height (H) from the backward face to the protruding face, and
    the second semiconductor element is a highly exothermic semiconductor element.

8. The semiconductor device according to claim 1, wherein a plurality of the first semiconductor elements are provided.

9. The semiconductor device according to claim 1, wherein the second semiconductor element is a highly exothermic semiconductor element.

* * * * *